(12) United States Patent
Wang et al.

(10) Patent No.: US 11,469,134 B2
(45) Date of Patent: Oct. 11, 2022

(54) PLATING CHUCK

(71) Applicant: ACM Research (Shanghai) Inc., Shanghai (CN)

(72) Inventors: Hui Wang, Shanghai (CN); Jian Wang, Shanghai (CN); Zhaowei Jia, Shanghai (CN); Hongchao Yang, Shanghai (CN)

(73) Assignee: ACM RESEARCH (SHANGHAI) INC., Shanghai (CN)

( * ) Notice: Subject to any disclaimer, the term of this patent is extended or adjusted under 35 U.S.C. 154(b) by 143 days.

(21) Appl. No.: 16/644,797

(22) PCT Filed: Sep. 7, 2017

(86) PCT No.: PCT/CN2017/100814
§ 371 (c)(1),
(2) Date: Mar. 5, 2020

(87) PCT Pub. No.: WO2019/047086
PCT Pub. Date: Mar. 14, 2019

(65) Prior Publication Data
US 2021/0066106 A1    Mar. 4, 2021

(51) Int. Cl.
*H01L 21/687* (2006.01)
*H01L 21/673* (2006.01)
(Continued)

(52) U.S. Cl.
CPC .......... *H01L 21/687* (2013.01); *H01L 21/288* (2013.01); *H01L 21/2885* (2013.01);
(Continued)

(58) Field of Classification Search
CPC ............... H01L 21/687; H01L 21/6732; H01L 21/67326; H01L 2224/13147;
(Continued)

(56) References Cited

U.S. PATENT DOCUMENTS 6,251,235 B1 *  6/2001  Talieh ................. H01L 21/2885
                                                              204/220
6,398,926 B1     6/2002  Mahneke
(Continued)

FOREIGN PATENT DOCUMENTS

CN          1609282 A       4/2005
CN        106337198 A       1/2017
(Continued)

OTHER PUBLICATIONS

International Search Report issued in corresponding International Application No. PCT/CN2017/100814, dated May 31, 2018 (4 pages).
(Continued)

*Primary Examiner* — Ermias T Woldegeorgis
(74) *Attorney, Agent, or Firm* — Osha Bergman Watanabe & Burton LLP

(57) ABSTRACT

A plating chuck for holding a substrate during plating processes, wherein the substrate has a notch area (3031) and a patterned region (3032) adjacent to the notch area (3031). The plating chuck comprises a cover plate (3033) configured to cover the notch area (3031) of the substrate to shield the electric field at the notch area (3031) when the substrate is being plated.

20 Claims, 33 Drawing Sheets

(51) Int. Cl.
*H01L 21/288* (2006.01)
*H01L 21/285* (2006.01)
*H01L 21/445* (2006.01)
*H01L 21/479* (2006.01)

(52) U.S. Cl.
CPC ...... *H01L 21/28562* (2013.01); *H01L 21/445* (2013.01); *H01L 21/479* (2013.01); *H01L 21/6732* (2013.01); *H01L 21/67326* (2013.01)

(58) Field of Classification Search
CPC ... H01L 2224/131; H01L 24/13; H01L 24/14; H01L 24/11; H01L 2224/11462; H01L 24/742; H01L 24/94; H01L 2224/94; H01L 21/479; H01L 21/445; H01L 21/28562; H01L 21/288; H01L 21/2885; H01L 2224/1146; C25D 17/001; C25D 17/008; C25D 17/004; C25D 17/08
See application file for complete search history.

(56) References Cited

U.S. PATENT DOCUMENTS

| | | |
|---|---|---|
| 6,908,540 B2 | 6/2005 | Kholodenko |
| 2003/0015806 A1* | 1/2003 | Chiba .................. H01L 23/544 |
| | | 257/797 |
| 2004/0035712 A1 | 2/2004 | Akram et al. |
| 2013/0062197 A1 | 3/2013 | He et al. |
| 2016/0305038 A1 | 10/2016 | McHugh et al. |
| 2017/0009367 A1 | 1/2017 | Harris et al. |

FOREIGN PATENT DOCUMENTS

| | | |
|---|---|---|
| CN | 107012495 A | 8/2017 |
| JP | 2002299305 A | 10/2002 |
| JP | 2009188205 A | 8/2009 |
| JP | 2016127069 A | 7/2016 |
| TW | 541597 B | 7/2003 |
| TW | 200835817 A | 9/2008 |
| WO | 2017/092029 A1 | 6/2017 |

OTHER PUBLICATIONS

Written Opinion issued in corresponding International Application No. PCT/CN2017/100814, dated May 31, 2018 (3 pages).
Office Action issued in corresponding JP Application No. 2020-513842 with English translation dated Jun. 15, 2021 (8 pages).
Office Action issued in corresponding CN Application No. 201780094366 dated Jul. 15, 2021 (6 pages).

\* cited by examiner

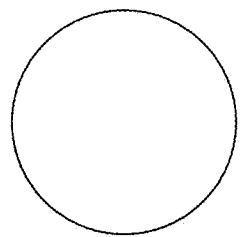 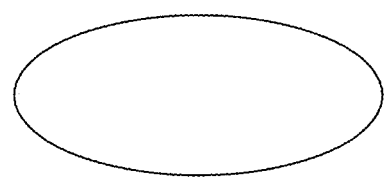
FIG 17a            FIG 17b
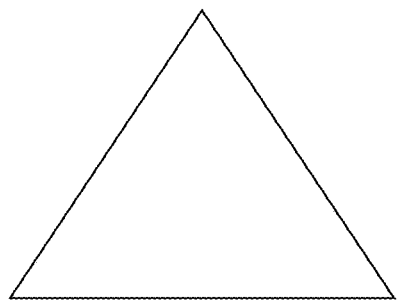 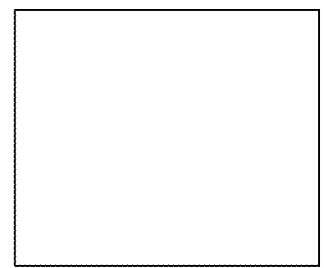
FIG 17c            FIG 17d
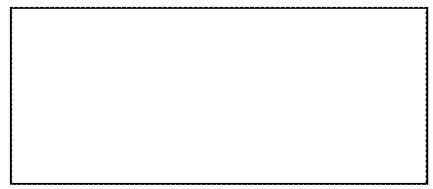 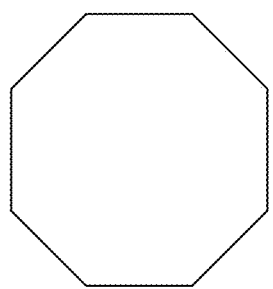
FIG 17e            FIG 17f Hydrophobic, φ>90°

US 11,469,134 B2

PLATING CHUCK

FIELD OF THE INVENTION

The present invention generally relates to a plating apparatus for plating metal films on a substrate, and more particularly relates to a plating chuck for holding a substrate during plating processes, which is capable of improving the uniformity of plated film nearby a notch area of the substrate.

BACKGROUND

In the field of semiconductor manufacturing, plating is a commonly used method to deposit metal films on a substrate. Especially, in the advanced packaging technology, copper pillars, solder bumps and the like which are used to realize chip substrate interconnection are formed on a substrate generally by electroplating since electroplating has advantages of simple process, low cost, easy to mass production, etc.

In mass production of wafer-level packaging, provided production substrates have a notch area at the edge thereof. The notch area remains covered with photoresist, and so the notch area is not conductive and thus will not be plated upon in a plating process. Although the non-plating of the notch area would not in itself be a problem, but the issue is that this lack of plating on the notch area causes excessive plating on the patterned region adjacent to the notch area, therefore causing the height of plated pillars at the patterned region adjacent to the notch area is higher than a target value.

FIG. 19A and FIG. 19B show two exemplary types of notch areas. Specifically, FIG. 19A shows a substrate 513 having an arched notch area 5131 and a patterned region 5132 adjacent to the notch area 5131 and FIG. 19B shows a substrate 713 having a substantially square-shaped notch area 7131 and a patterned region 7132 adjacent to the notch area 7131. During the plating process, due to the non-plating of the notch areas 5131, 7131, the electric field at the patterned regions 5132, 7132 are enhanced, resulting in the plating quantity on the patterned regions 5132, 7132 is higher than other patterned regions on the substrates 513, 713, and so the height of plated pillars on the patterned regions 5132, 7132 is out of process requirement. As shown in FIG. 20A, FIG. 20A shows a fundamental principle that why the patterned region adjacent to the notch area will be plated excessively. Since the notch area 2031 is not conductive, during the plating process, power lines from a virtual anode 2001 corresponding to the notch area 2031 are transmitted to the patterned region 2032 adjacent to the notch area 2031, causing excessive plating on the patterned region 2032.

SUMMARY

Accordingly, an object of the present invention is to provide a plating chuck for holding a substrate during plating processes. The substrate has a notch area and a patterned region adjacent to the notch area. The plating chuck comprises a cover plate configured to cover the notch area of the substrate to shield the electric field at the notch area when the substrate is being plated.

In the plating processes, the present invention utilizes the cover plate to cover the notch area of the substrate, and hence power lines from a virtual anode corresponding to the notch area are shielded, weakening the influence on the patterned region adjacent to the notch area, therefore further reducing the thickness of plated film on the patterned region adjacent to the notch area and improving the uniformity of plated film on the substrate. Preferably, the cover plate also covers partial of the patterned region adjacent to the notch area to weaken the electric field at the patterned region adjacent to the notch area to reduce the thickness of plated film on the patterned region adjacent to the notch area.

BRIEF DESCRIPTION OF THE DRAWINGS

FIGS. 17a-17f show substrates with various shape.

DETAILED DESCRIPTION

Figure 1:
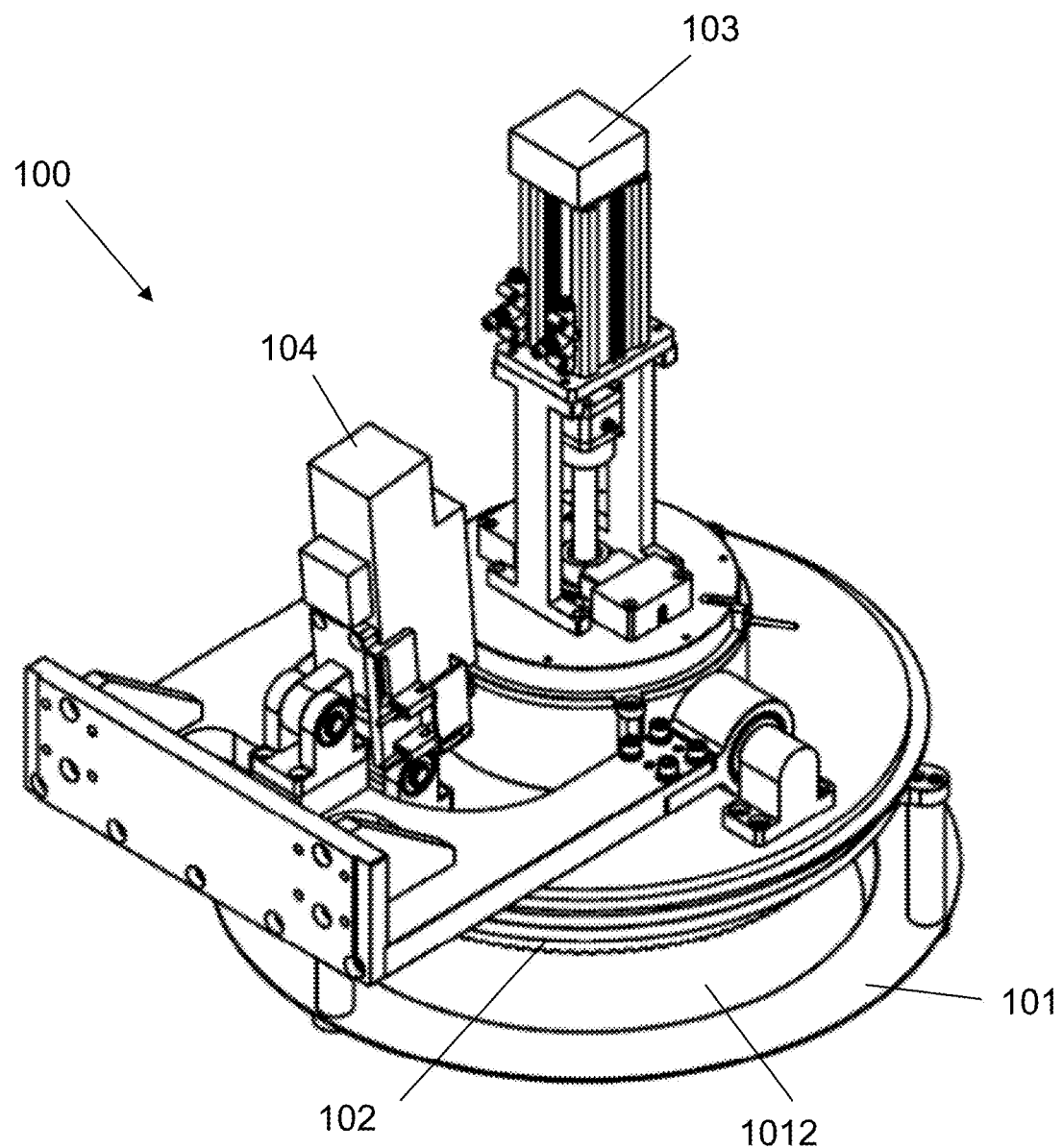
FIG. 1 is a perspective view of an apparatus for holding a substrate according to the present invention.
Figure 2:
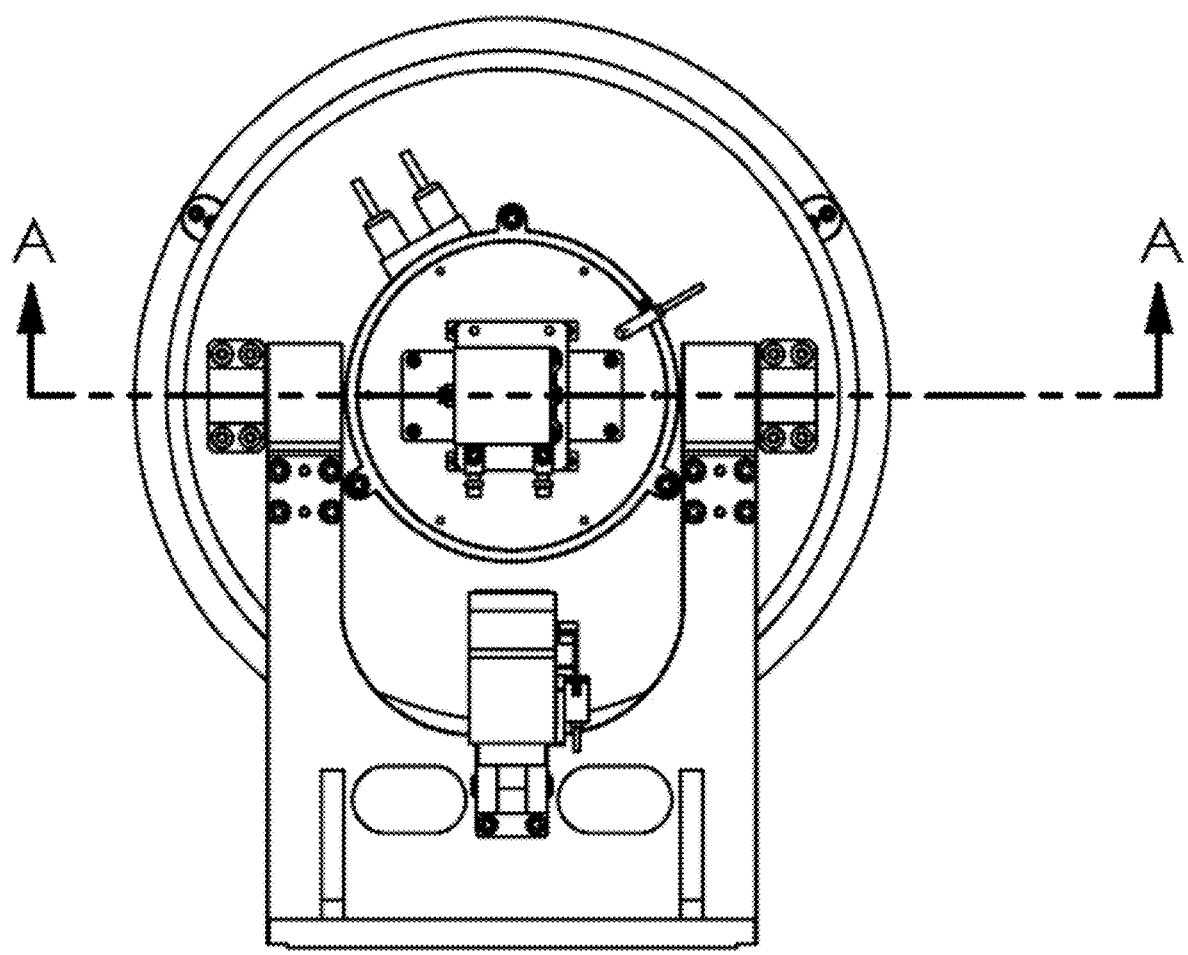
FIG. 2 is a top view of the apparatus which holds a substrate.
Figure 3:
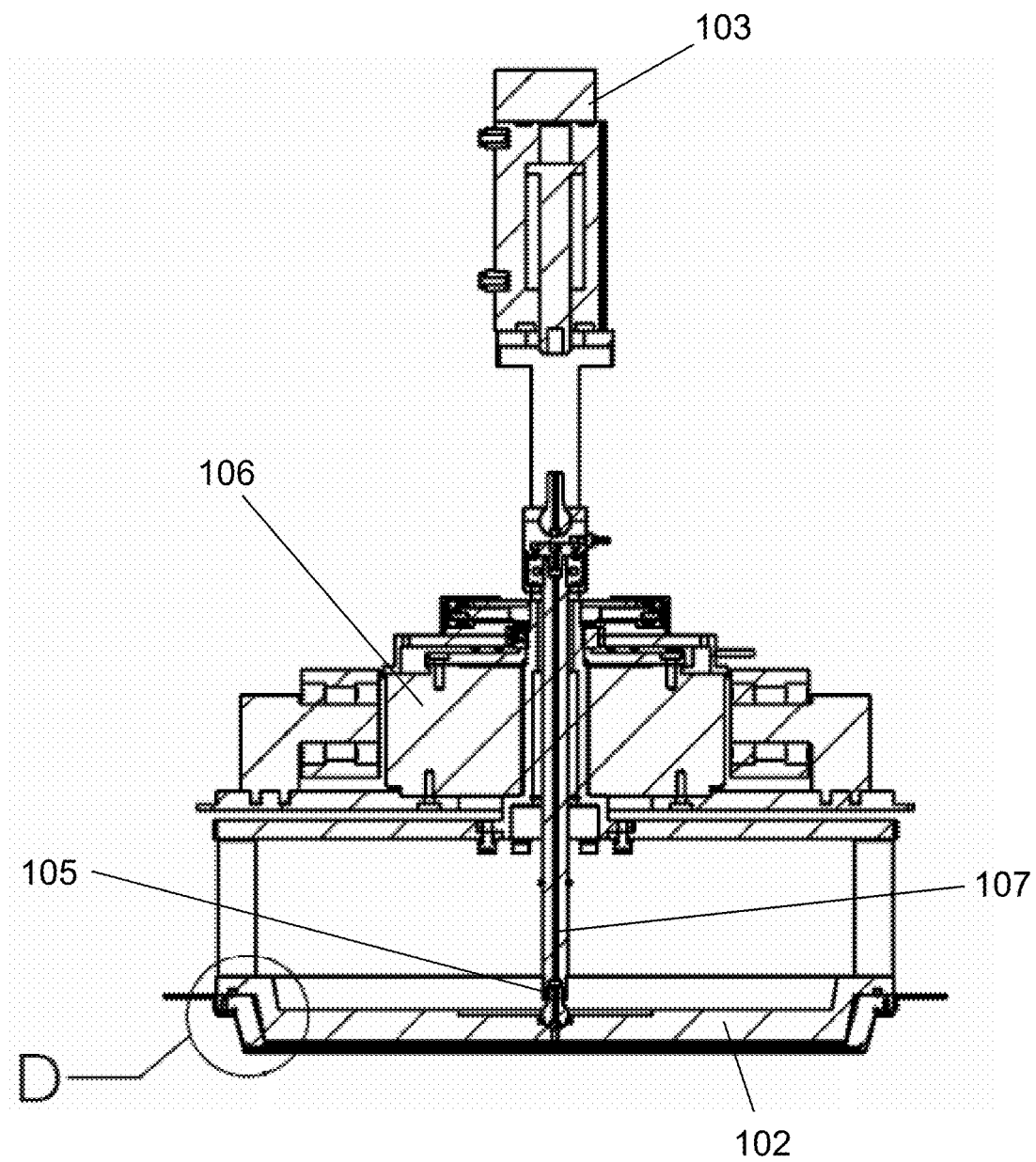
FIG. 3 is a cross-sectional view taken along line A-A of FIG. 2.

The present invention provides an apparatus for holding a substrate when the substrate is processed, such as, immersed into an electrolyte solution for plating. When the substrate is immersed into the electrolyte solution for plating a metal layer on a front side of the substrate, an edge of the front side of the substrate and a back side of the substrate should be protected and avoid contacting with the electrolyte solution. Therefore, it is different from existing technologies, the apparatus of the present invention utilizes a seal shell to prevent the electrolyte solution from getting to the edge of the front side of the substrate and the back side of the substrate when the substrate is immersed into the electrolyte solution for plating, and the seal shell is replaceable.

Referring to FIG. 1 to FIG. 6, the apparatus 100 for holding a substrate of the present invention is illustrated. The apparatus 100 has a chuck cup 101 and a chuck plate 102. The chuck cup 101 has a cup-shaped base portion 1011. The base portion 1011 confines a pass-through receiving space 1012. The base portion 1011 has a bottom surface, an outer surface and an inner surface. The inner surface of the base portion 1011 is inclined, which is beneficial to load the substrate 113. An upper end of the base portion 1011 extends outward to form a brim 1013. The inner surface at a lower end of the base portion 1011 protrudes obliquely upward to form a supporting portion 1014 for supporting the substrate 113 when the substrate 113 is put in the receiving space 1012. A groove 1015 is formed at the lower end of the base portion 1011. The chuck cup 101 is made of metal or carbon fiber, such as stainless steel, Ti, Ta, Al alloy, etc.

The chuck plate 102 connects to a vertical driving device 103 through a universal shaft 105. The vertical driving device 103 drives the chuck plate 102 to go up or down. When the substrate 113 is loaded into the receiving space 1012 and supported by the supporting portion 1014, the vertical driving device 103 drives the chuck plate 102 to go down and press against the back side of the substrate 113, so the substrate 113 is chucked by the chuck cup 101 and the chuck plate 102. The front side of the substrate 113 is exposed to process. After the process is completed, the vertical driving device 103 drives the chuck plate 102 to go up and the chuck plate 102 leaves from the back side of the substrate 113. Then the substrate 113 is taken out of the receiving space 1012. The vertical driving device 103 can be a cylinder or a motor. The surface of the chuck plate 102 which contacts with the back side of the substrate 113 defines a plurality of slots 1021. When the chuck plate 102 leaves from the back side of the substrate 113, the air easily enters the space between the chuck plate 102 and the back side of the substrate 113 from the slots 1021, which makes the substrate 113 easily break away from the chuck plate 102. For making the substrate 113 easily break away from the chuck plate 102, $N_2$ gas can also be supplied to the back side of the substrate 113 through a gas pipe 107 which is disposed in the universal shaft 105. The chuck plate 102 is made of PP, PVDF, PEEK, PET or the like.

An o-ring 108 is disposed between the chuck plate 102 and the chuck cup 101 for buffering when the chuck plate 102 is driven to go down for chucking the substrate 113. Besides, the o-ring 108 can prevent the electrolyte solution from entering the receiving space 1012 when the substrate 113 is immersed into the electrolyte solution for plating. For meeting different process requirements, the apparatus 100 has an angle control driving device 104 and a rotating driving device 106. The angle control driving device 104 drives the chuck plate 102 and the chuck cup 101 to tilt an angle when the chuck plate 102 and the chuck cup 101 fix the substrate 113 for process. The rotating driving device 106 drives the chuck plate 102 and the chuck cup 101 to rotate when the chuck plate 102 and the chuck cup 101 fix the substrate 113 for process.

Figure 4:
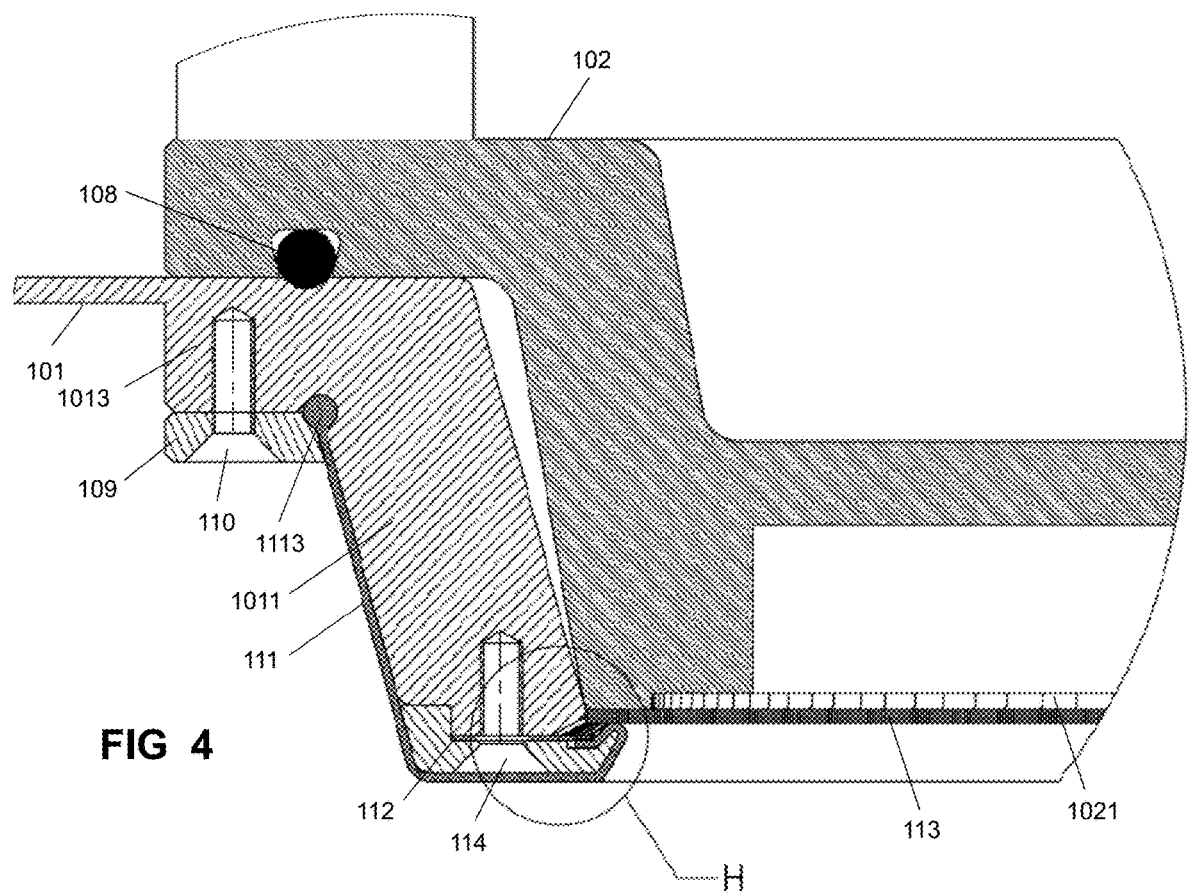
FIG. 4 is a partial enlarged view of a portion D encircled in FIG. 3.
Figure 5:
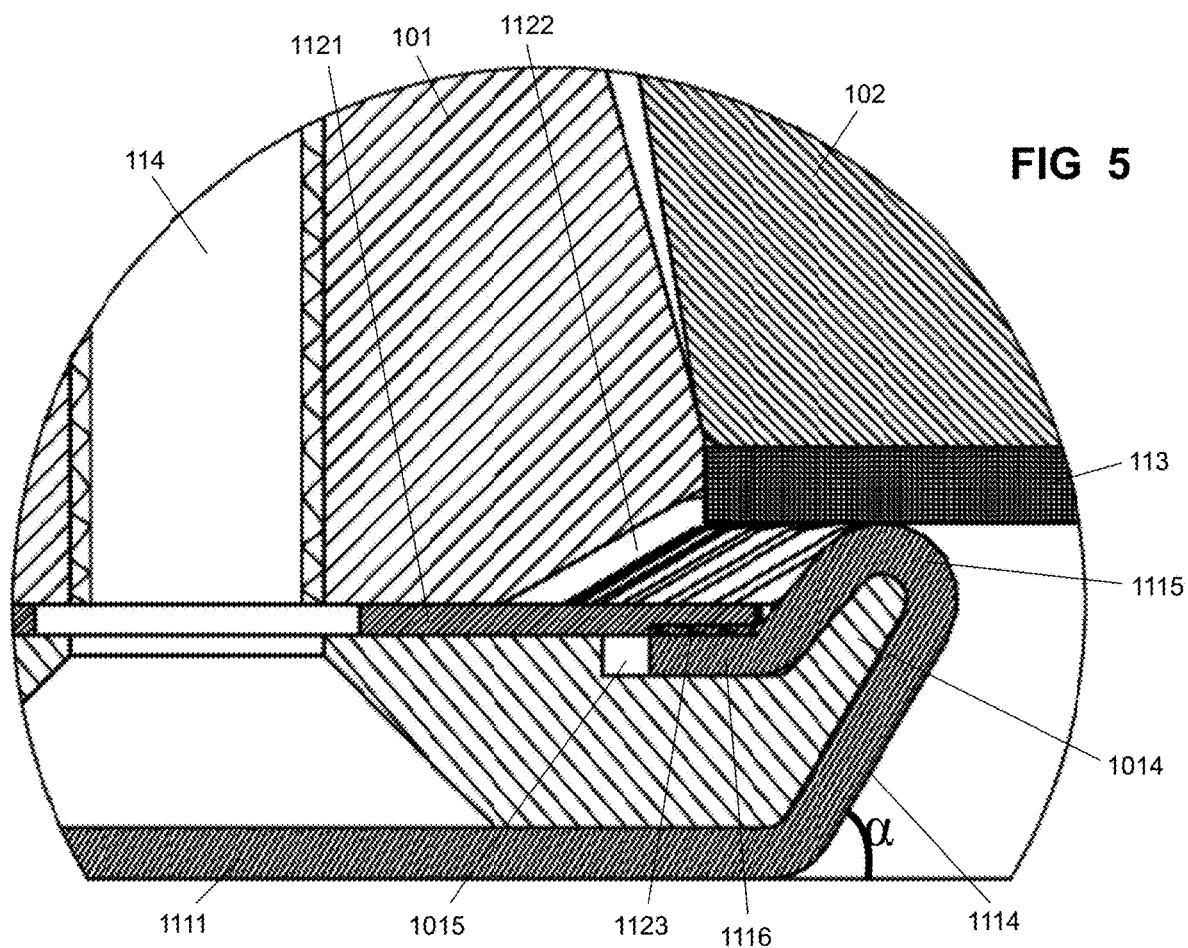
FIG. 5 is a partial enlarged view of a portion H encircled in FIG. 4.
Figure 6:
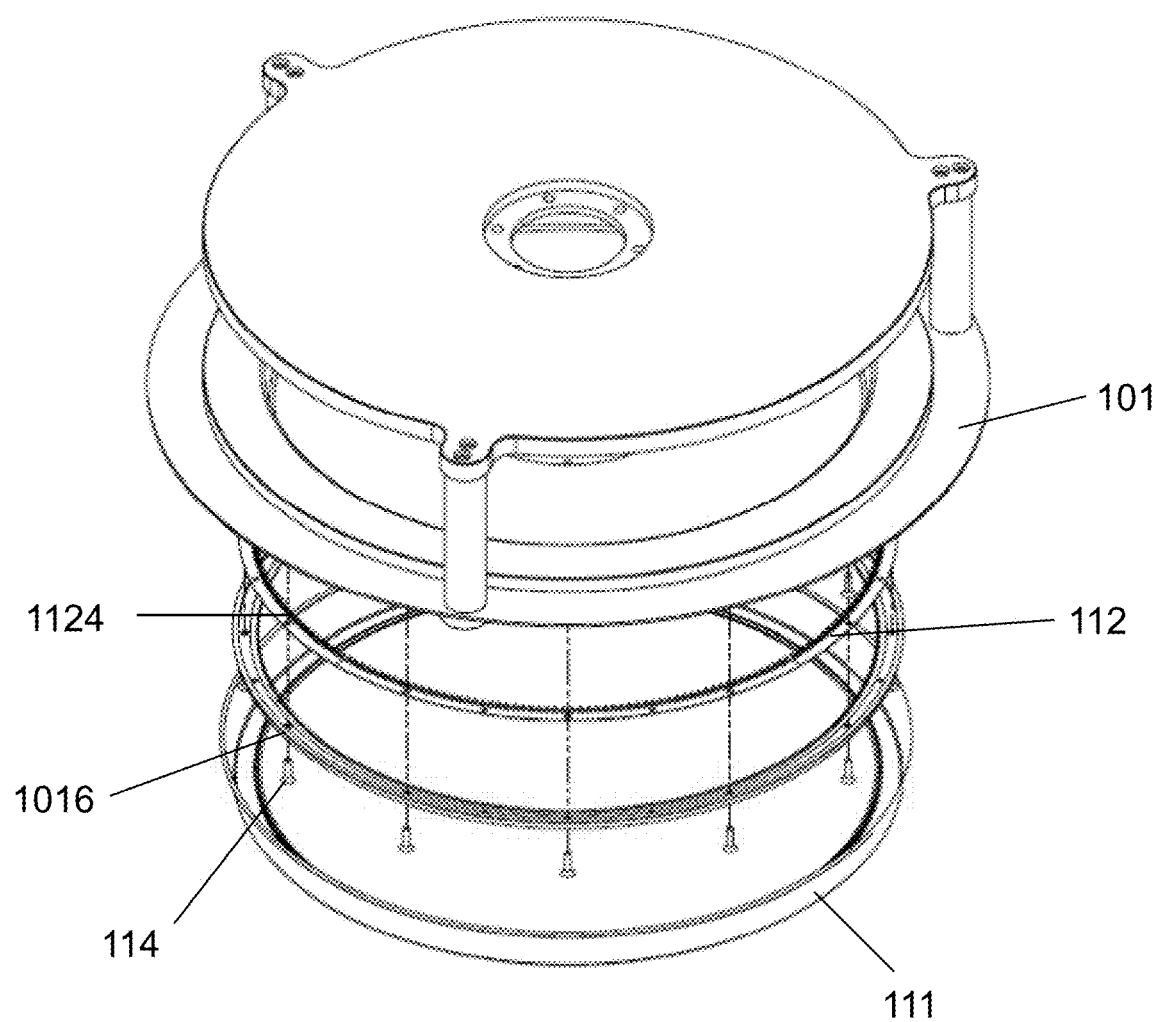
FIG. 6 is an exploded view showing a chuck cup, a contact ring and a seal shell of the apparatus.
Figure 7:
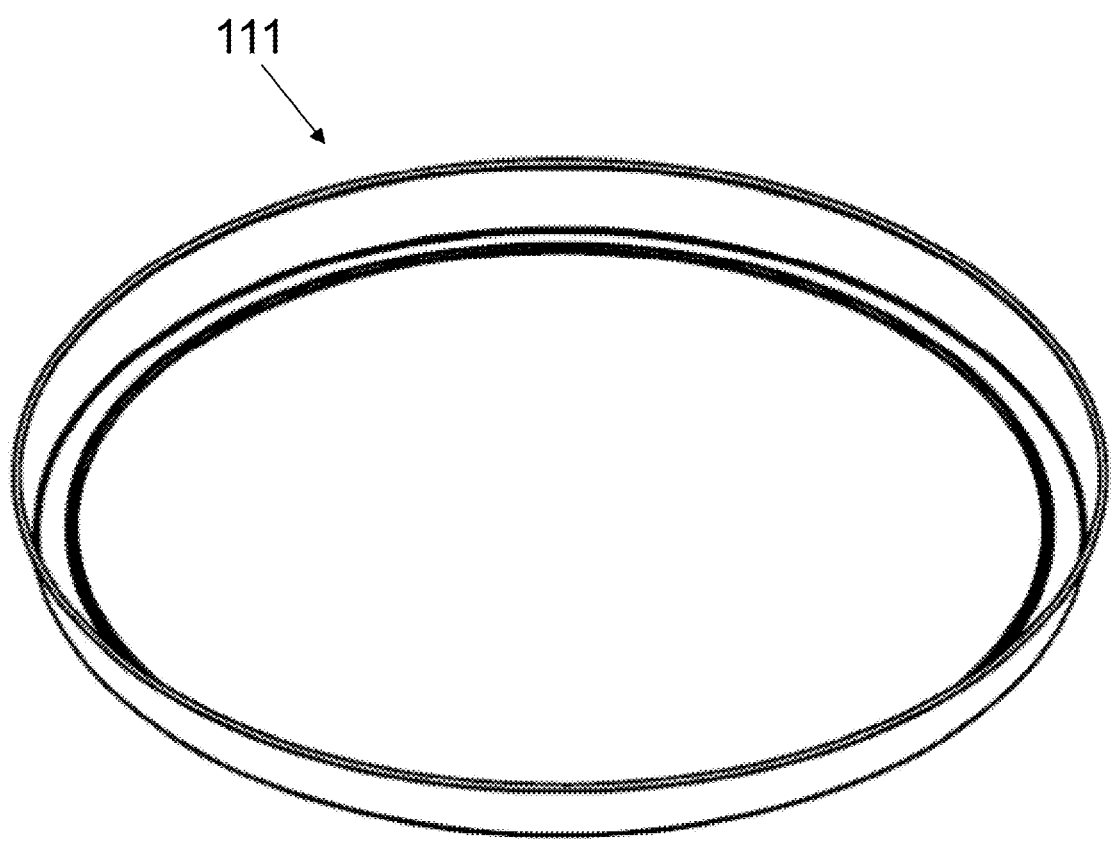
FIG. 7 is a perspective view of the seal shell of the apparatus.
Figure 8:
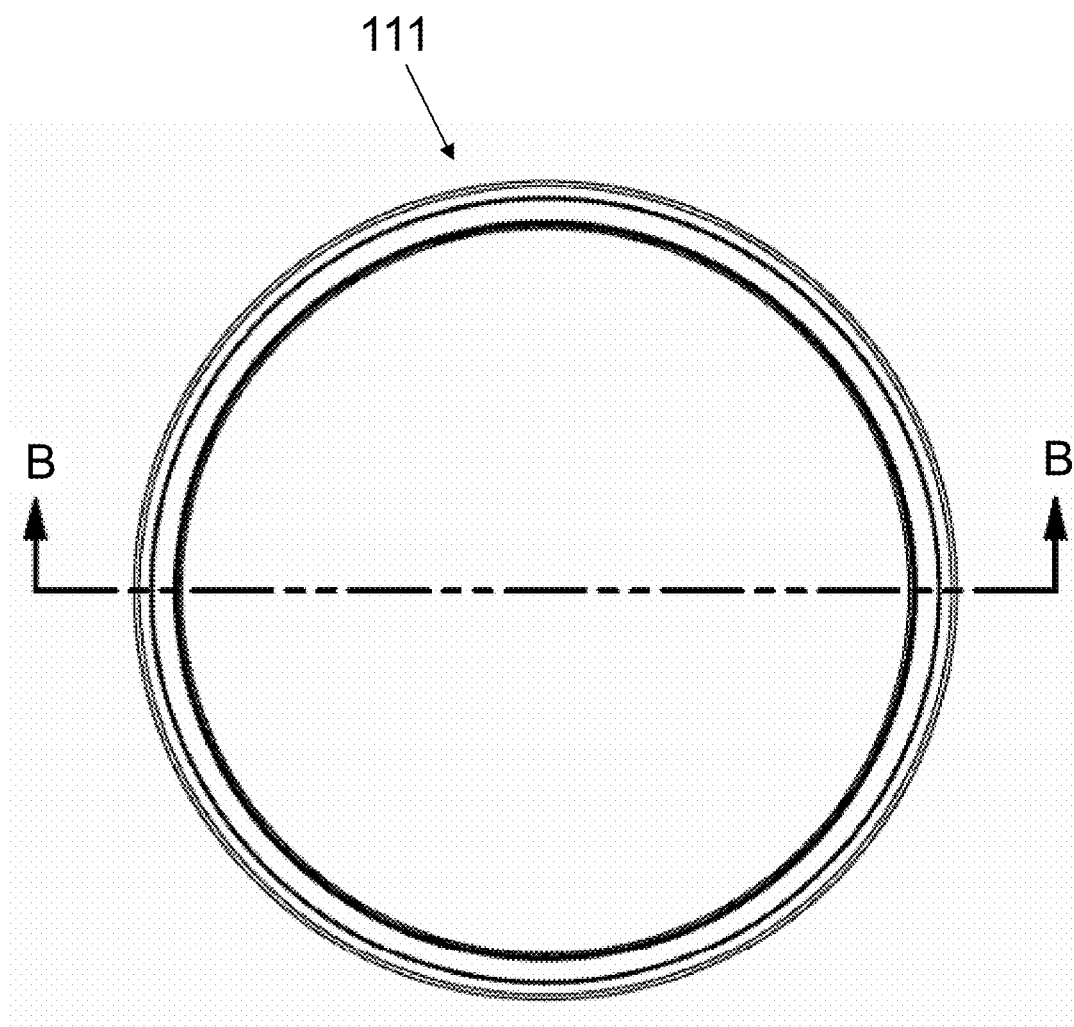
FIG. 8 is a top view of the seal shell.
Figure 9:
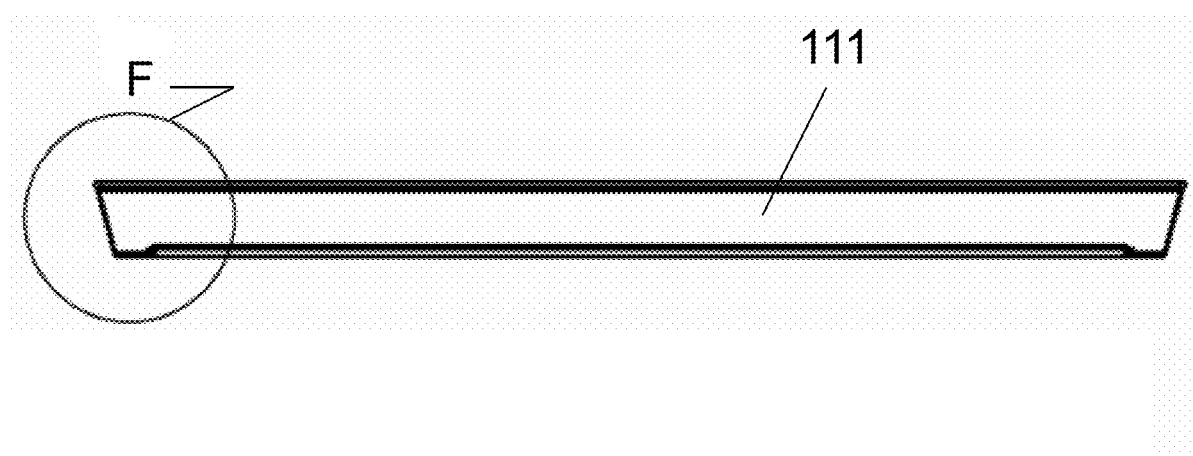
FIG. 9 is a cross-sectional view taken along line B-B of FIG. 8.
Figure 10:
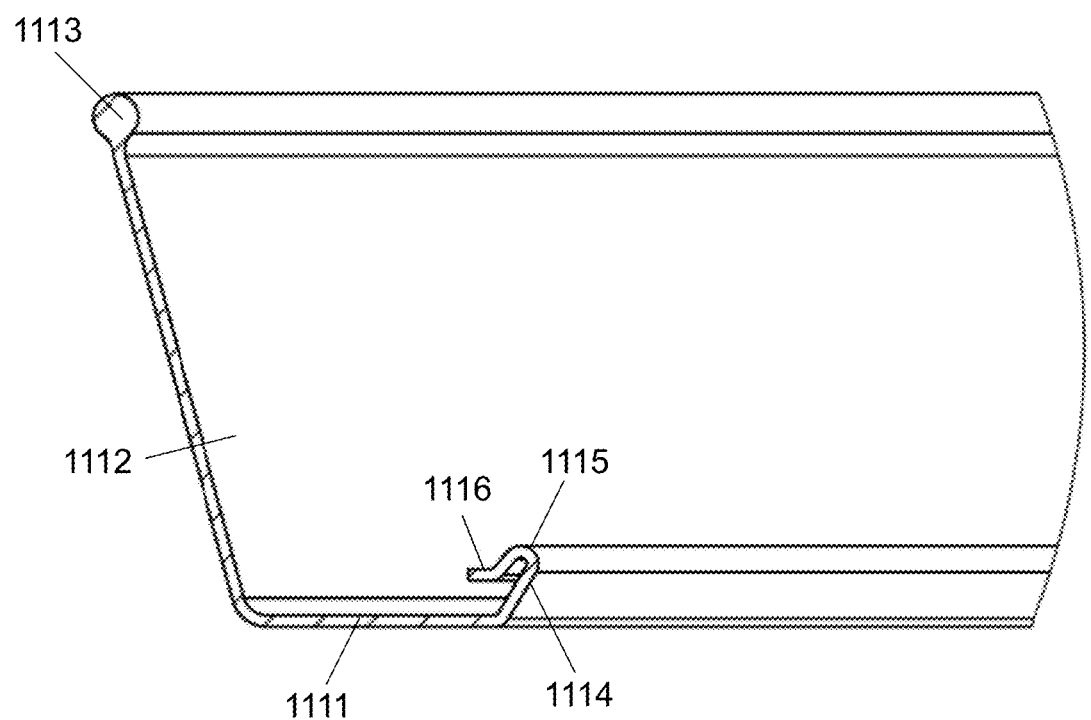
FIG. 10 is a partial enlarged view of a portion F encircled in FIG. 9.

Referring to FIG. 7 to FIG. 10, a seal shell 111 of the apparatus 100 is illustrated. The seal shell 111 has a bottom wall 1111, an outer wall 1112 and an inner wall 1114. A tip end of the outer wall 1112 has a protrusion 1113. The inner wall 1114 crooks to form a lip seal portion 1115. A tip end of the inner wall 1114 which connects to the lip seal portion 1115 horizontally extends to form a fixing portion 1116. The seal shell 111 wraps the chuck cup 101. Specifically, as shown in FIG. 4 and FIG. 5, the bottom wall 1111 of the seal shell 111 wraps the bottom surface of the base portion 1011 of the chuck cup 101. The outer wall 1112 of the seal shell 111 wraps the outer surface of the base portion 1011 of the chuck cup 101. The lip seal portion 1115 wraps the supporting portion 1014 of the chuck cup 101. The fixing portion 1116 of the seal shell 111 is located in the groove 1015 of the chuck cup 101. For fixing the seal shell 111 and the chuck cup 101 together, a fixing ring 109 is provided and disposed at the bottom of the brim 1013 of the chuck cup 101. The fixing ring 109 squeezes the protrusion 1113 of the seal shell 111 and then the fixing ring 109 is fixed at the bottom of the brim 1013 of the chuck cup 101 through a plurality of screws 110. The thickness of the seal shell 111 is 0.1 mm to 2 mm, and preferably, 0.3 mm to 1 mm During a wet processing, the lip seal portion 1115 of the seal shell 111 seals the edge of the front side of the substrate 113 and a chemical solution cannot get to the edge of the front side of the substrate 113 and the back side of the substrate 113. Therefore, after the wet processing is completed, the edge of the front side of the substrate 113 and the back side of the substrate 113 are dry. Besides, because the seal shell 111 wraps the chuck cup 101, the seal shell 111 protects the chuck cup 101 and prevents the chuck cup 101 from contacting with the chemical solution, avoiding the chuck cup 101 eroding by the chemical solution. Because of the protection of the seal shell 111, the substrate 113 held by the apparatus 100 can be immersed into the chemical solution for process, such as, plating. The liquid level of the chemical solution is below the fixing ring 109, avoiding the chemical solution eroding the fixing ring 109 and the screws 110.

Figure 18:
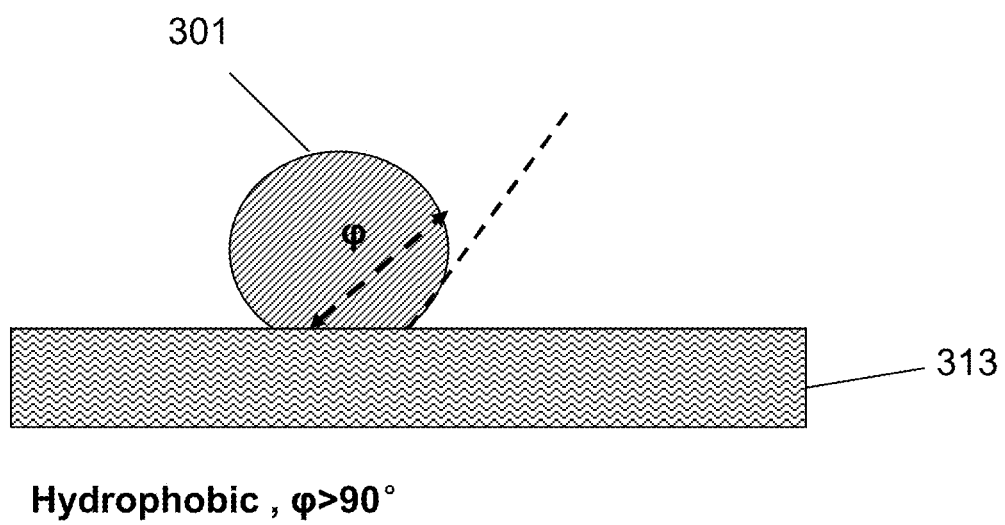
FIG. 18 shows a fundamental principle of hydrophobic.
Figure 19A:
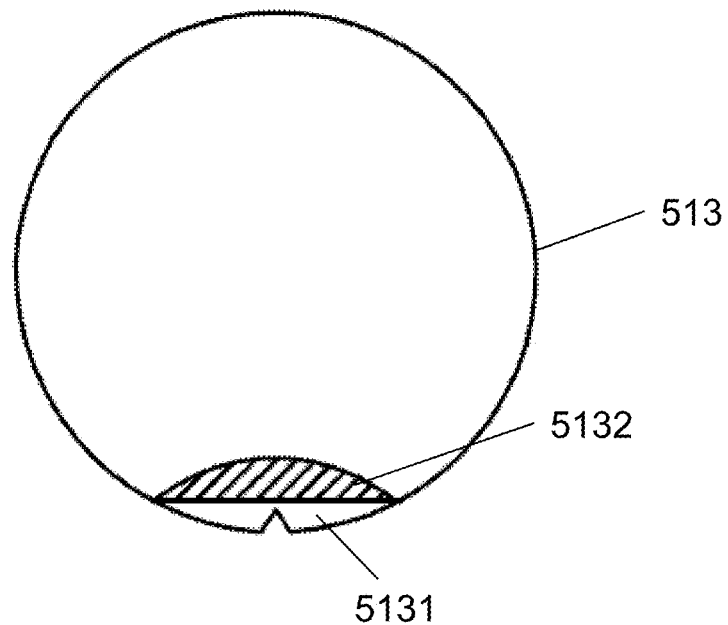
FIG. 19A and FIG. 19B show two exemplary types of notch areas.
Figure 19B:
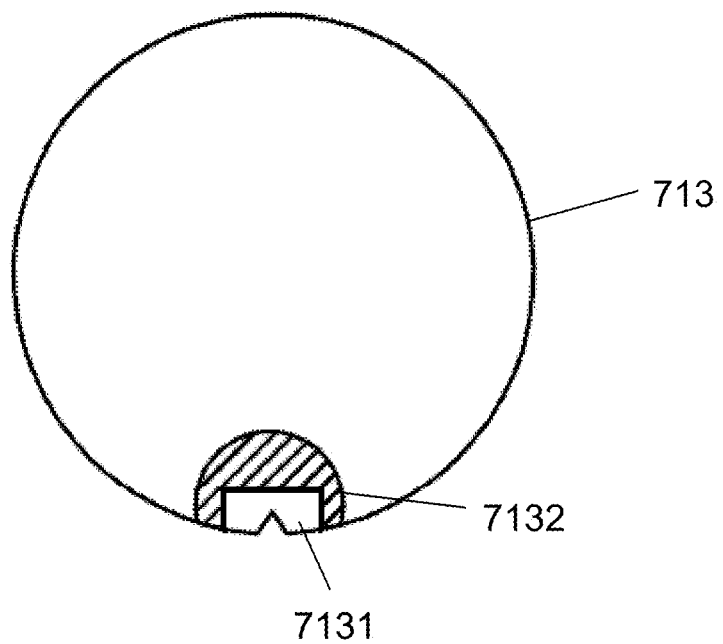

The seal shell 111 is made by molding. The material for making the seal shell 111 is rubber, such as fluorine rubber, silicon rubber, nitrile butadiene rubber. The material for making the seal shell 111 also can be plastic, such as teflon. The material for making the seal shell 111 is soft and has a certain degree of hardness. The hardness of the material varies from 20 to 70 tested by a durometer, and preferably from 40 to 60. The material for making the seal shell 111 is hydrophobic and the material surface roughness Ra<8 μm. As shown in FIG. 18, when a contacting angle Φ between a liquid drop 301 and a substrate 313 is larger than 90°, the substrate 313 is hydrophobic. The contacting angle Φ is related to the material surface roughness. The contacting angle Φ decreases while the material surface roughness increases. If the material surface is too rough, larger than 8

µm, the seal effect will become worse. Therefore, to achieve a better seal effect, the material surface roughness is preferably less than 5 µm.

The inner wall 1114 of the seal shell 111 tilts an angle α relative to the horizontal plane. The angle α is smaller than 90°. When the substrate 113 needs to immerse into the electrolyte solution for plating, the apparatus 100 holds the substrate 113 and then the apparatus 100 moves from a load or unload position to a process position. The substrate 113 is totally immersed into the electrolyte solution. During the plating process, the apparatus 100 rotates and the rotating speed is 3 rpm to 200 rpm. During the process of immersing the substrate 113, the air can be extruded out along the inner wall 1114 of the seal shell 111. On the other hand, during the plating process, $H_2$ gas may generate on the front surface of the substrate 113. The gas bubble should be extruded out too. Otherwise, the air or gas bubble will cause void issue in the deposited metal.

Figure 11:
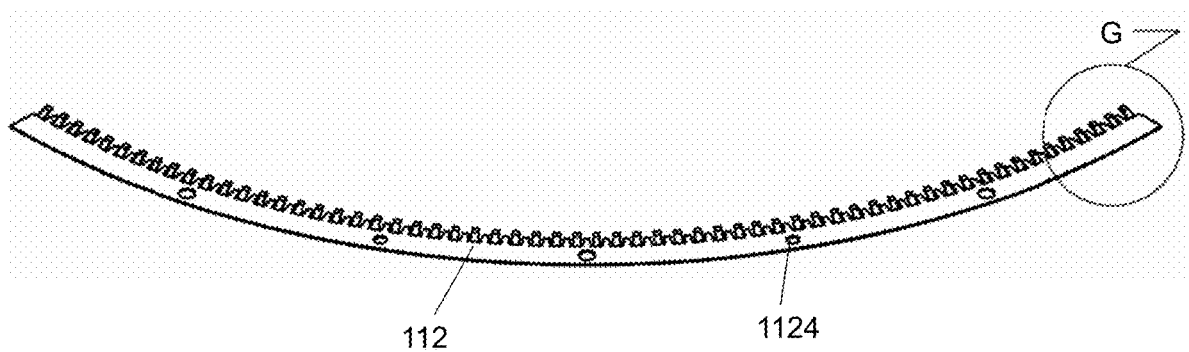
FIG. 11 is a cross-sectional view of the contact ring of the apparatus.
Figure 12:
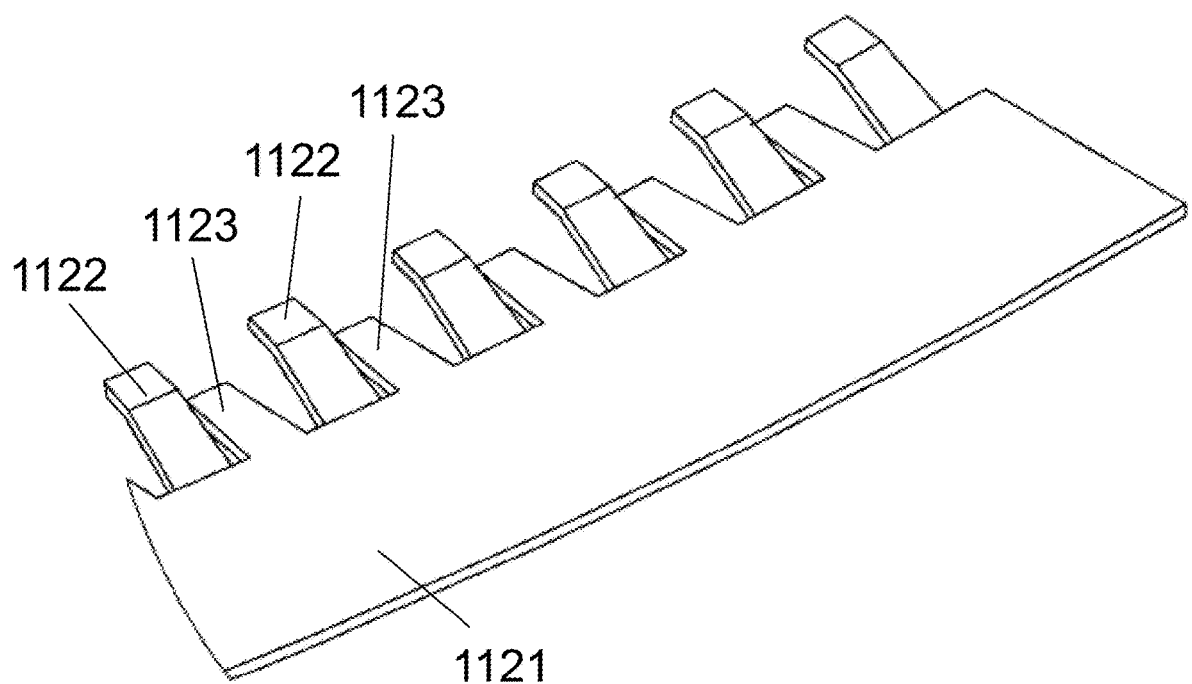
FIG. 12 is a partial enlarged view of a portion G encircled in FIG. 11.
Figure 13:
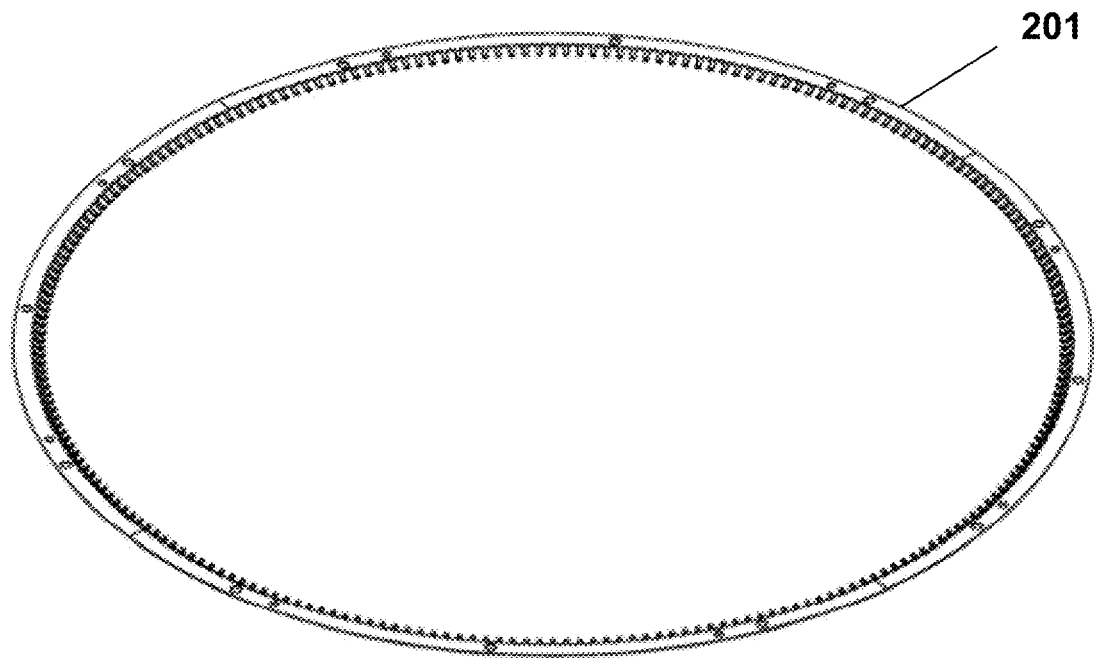
FIG. 13 is a perspective view showing a press plate and a conduct ring according to another embodiment of the present invention.
Figure 13:
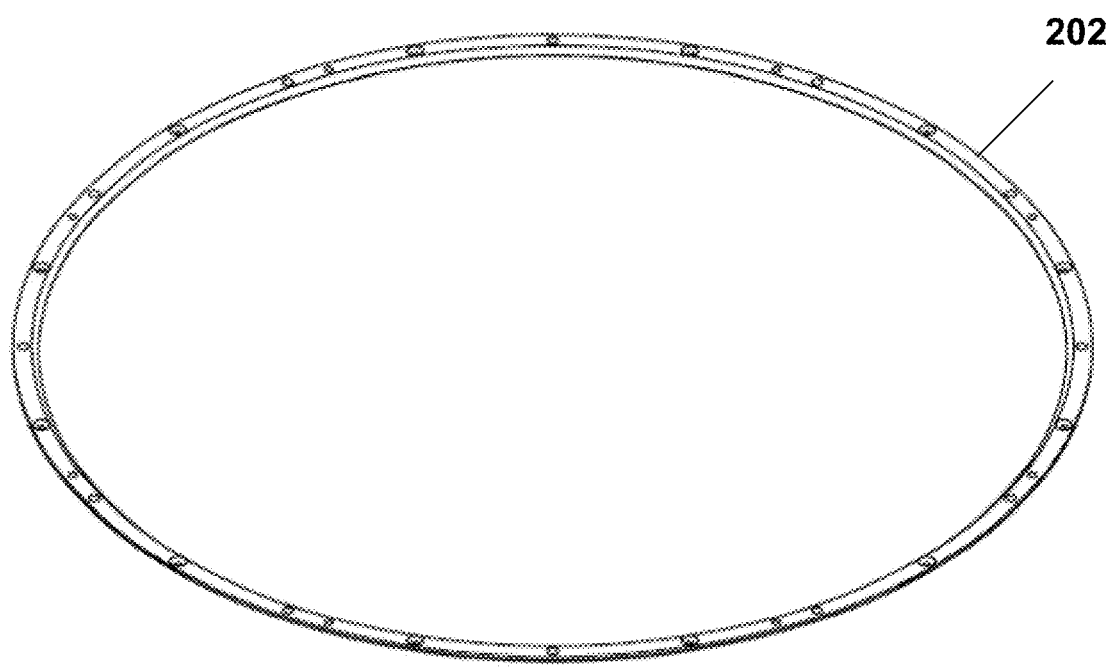
Figure 14:
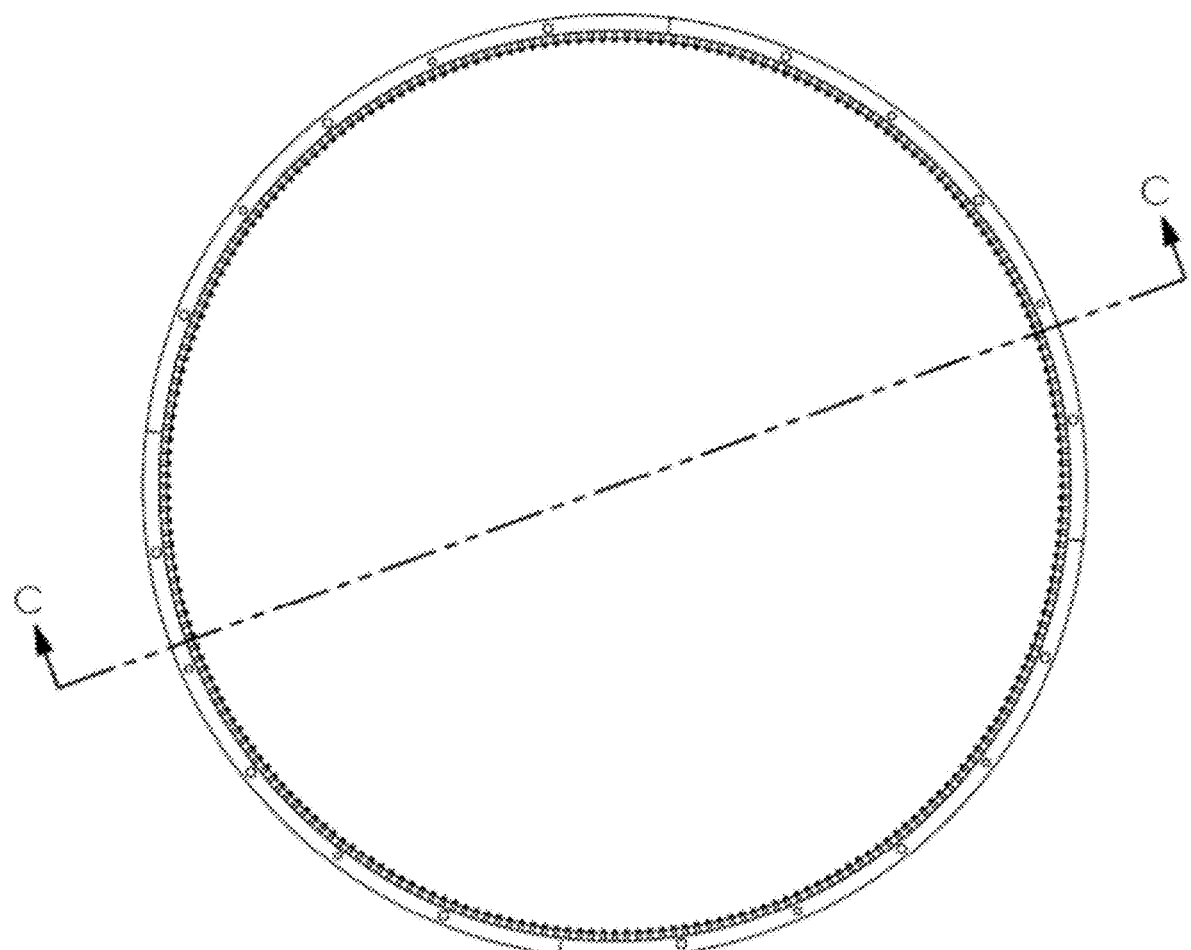
FIG. 14 is a top view showing the press plate and the conduct ring.
Figure 15:
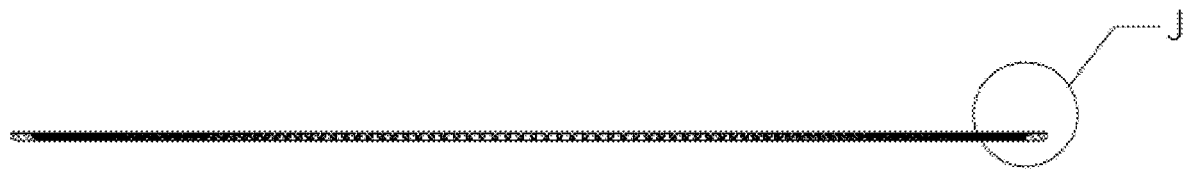
FIG. 15 is a cross-sectional view taken along line C-C of FIG. 14.
Figure 16:
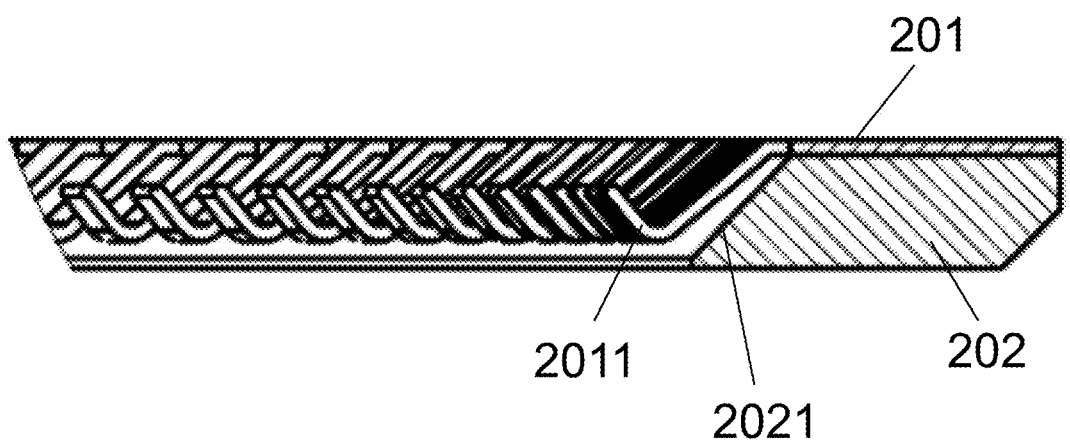
FIG. 16 is a partial enlarged view of a portion J encircled in FIG. 15.

When the apparatus 100 is used for electroplating a metal layer on the front side of the substrate 113, a contact ring 112 is provided for electrical current conduction. As shown in FIG. 11 and FIG. 12, the contact ring 112 has a body portion 1121, a plurality of first finger portions 1122 and a plurality of second finger portions 1123. For mounting the contact ring 112, the lower end of the base portion 1011 of the chuck cup 101 is detachable. For clear illustration purposes, the lower end of the base portion 1011 of the chuck cup 101 is named as pedestal. The bottom surface of the pedestal defines a plurality of first screw holes 1016. The body portion 1121 of the contact ring 112 defines a plurality of second screw holes 1124. A plurality of screws 114 pass through the first screw holes 1016 and the second screw holes 1124 for fixing the body portion 1121 of the contact ring 112 and the pedestal of the chuck cup 101 together with the base portion 1011 of the chuck cup 101. The plurality of first finger portions 1122 contact with a seed layer on the edge of the front side of the substrate 113 and contact points are located in less than 2 mm distance from the edge of the substrate 113. During the electroplating process, the substrate 113 is connected with a power supply electrode and the current is conducted through the contact ring 112. The chuck cup 101 is made of conductive material for electrical current conduction. The plurality of second finger portions 1123 press against the fixing portion 1116 of the seal shell 111, which makes the fixing portion 1116 of the seal shell 111 is fixed in the groove 1015 of the chuck cup 101, avoiding the seal shell 111 falling off from the chuck cup 101. The first finger portion 1122 and the second finger portion 1123 are disposed alternatively. For a 300 mm substrate, the number of the first finger portions 1122 should be no less than 200. If the number of the first finger portions 1122 is too few, the electrical current distribution on the substrate 113 is non-uniform, which makes the deposition rate on the substrate 113 is non-uniform. The contact ring 112 is made of conductive materials, such as stainless steel, Cu, Ti, Ir, Ta, Au, Ag, Pt and alloys like that. Also the contact ring 112 can be made of stainless steel, Ti, Ta, Al and alloys with Pt coating or Au coating. Also the contact ring 112 is made of other materials with high conductivity. Preferably, the contact ring 112 is made of spring steel.

As shown in FIG. 17a to FIG. 17f, it is recognized that the shape of the substrate 113 can be circle, oval, triangle, square, rectangle, octagon, etc. And correspondingly, the chuck cup 101 and the chuck plate 102 should be designed to accommodate to the substrate 113.

For assembling the seal shell 111 and the contact ring 112, firstly, detach the pedestal from the base portion 1011 of the chuck cup 101, and then the lip seal portion 1115 of the seal shell 111 wraps the supporting portion 1014 of the chuck cup 101 and the fixing portion 1116 of the seal shell 111 is located in the groove 1015 of the chuck cup 101. A plurality of screws is used for fixing the body portion 1121 of the contact ring 112 together with the pedestal of the chuck cup 101 for making the plurality of second finger portions 1123 of the contact ring 112 press against the fixing portion 1116 of the seal shell 111 in the groove 1015 of the chuck cup 101. Secondly, the plurality of screws 114 pass through the first screw holes 1016 of the chuck cup 101 and the second screw holes 1124 of the contact ring 112 for fixing the pedestal together with the base portion 1011 of the chuck cup 101. Thirdly, the bottom wall 1111 and the outer wall 1112 of the seal shell 111 respectively wrap the bottom surface and the outer surface of the base portion 1011 of the chuck cup 101. Lastly, the fixing ring 109 is fixed at the bottom of the brim 1013 of the chuck cup 101 through the plurality of screws 110, and the fixing ring 109 squeezes the protrusion 1113 of the seal shell 111.

An electroplating process sequence by using the apparatus 100 includes steps as follow:

Step 1: the apparatus 100 moves to a load or unload position.

Step 2: the vertical driving device 103 drives the chuck plate 102 to go up.

Step 3: the substrate 113 is loaded on the lip seal portion 1115 of the seal shell 111 and the front side of the substrate 113 exposes and faces down.

Step 4: the vertical driving device 103 drives the chuck plate 102 to go down for chucking the substrate 113, the lip seal portion 1115 of the seal shell 111 seals the edge of the front side of the substrate 113 and the plurality of first finger portions 1122 of the contact ring 112 contact with a seed layer on the edge of the front side of the substrate 113.

Step 5: the angle control driving device 104 drives the chuck plate 102 and the chuck cup 101 to tilt an angle.

Step 6: the rotating driving device 106 drives the chuck plate 102 and the chuck cup 101 to rotate at a preset rotating speed and meanwhile the apparatus 100 moves to a process position at which the substrate 113 is immersed into the electrolyte solution.

Step 7: the angle control driving device 104 drives the chuck plate 102 and the chuck cup 101 to turn, making the chuck plate 102 and the chuck cup 101 stay at a vertical status.

Step 8: the electric current is turned on for electroplating a metal layer on the front side of the substrate 113.

Step 9: after the electroplating process is completed, the apparatus 100 moves to a rinse position and then rotates at a high speed, the electrolyte solution is rinsed off from the surface of the substrate 113.

Step 10: the apparatus 100 moves to the unload position, and $N_2$ gas is supplied to the back side of the substrate 113. The vertical driving device 103 drives the chuck plate 102 to go up and then the substrate 113 is taken from the lip seal portion 1115 of the seal shell 111.

As described above, the apparatus 100 of the present invention utilizes the seal shell 111 wrapping the chuck cup 101, when the apparatus 100 is used for holding the substrate 113 and immersing the substrate 113 into the electrolyte solution for plating, the seal shell 111 protects the edge of the front side of the substrate 113, the back side of the substrate 113 and the contact ring 112 inside the chuck cup 101, avoiding the edge of the front side of the substrate 113, the back side of the substrate 113 and the contact ring 112 inside the chuck cup 101 contacting with the electrolyte solution.

The seal shell 111 is soft, and the chuck cup 101 is made of a material with higher degree of hardness than the seal shell 111, when the seal shell 111 wraps the chuck cup 101, the chuck cup 101 does not deform. Therefore, after chucking the substrate 113, the seal shell 111 seals the substrate surface very gently without damage to the substrate surface. The seal effect of the seal shell 111 is very good. Besides, the thickness of the seal shell 111 is thick, so the life time of the seal shell 111 is long. Moreover, after the apparatus 100 is used for a period of time, it just needs to replace the contact ring 112 and the seal shell 111, and the other parts of the apparatus 100 do not need to replace, which reduces the production cost.

Referring to FIG. 13 to FIG. 16, in another embodiment, a conduct ring 201 for electrical current conduction and a press plate 202 for fixing the seal shell 111 are provided. The function of the assembly of the conduct ring 201 and the press plate 202 is the same as the contact ring 112, so the assembly of the conduct ring 201 and the press plate 202 can replace the contact ring 112. It is recognized that if the apparatus is used for electroless plating, the conduct ring 201 is omitted. The conduct ring 201 has a plurality of finger portions 2011 which contact with the edge of the front side of the substrate 113. The press plate 202 has a slope 2021 for matching up to the finger portions 2011 of the conduct ring 201. For assembling the seal shell 111, firstly, detach the pedestal from the base portion 1011 of the chuck cup 101, and then the lip seal portion 1115 of the seal shell 111 wraps the supporting portion 1014 of the chuck cup 101 and the fixing portion 1116 of the seal shell 111 is located in the groove 1015 of the chuck cup 101. A first group of screws is used for fixing the press plate 202 together with the pedestal of the chuck cup 101 for making the press plate 202 press against the fixing portion 1116 of the seal shell 111 in the groove 1015 of the chuck cup 101. Secondly, a second group of screws is used for fixing the pedestal of the chuck cup 101, the press plate 202 and the conduct ring 201 together with the base portion 1011 of the chuck cup 101. Thirdly, the bottom wall 1111 and the outer wall 1112 of the seal shell 111 respectively wrap the bottom surface and the outer surface of the base portion 1011 of the chuck cup 101. Lastly, the fixing ring 109 is fixed at the bottom of the brim 1013 of the chuck cup 101 through the plurality of screws 110, and the fixing ring 109 squeezes the protrusion 1113 of the seal shell 111.

Figure 20A:
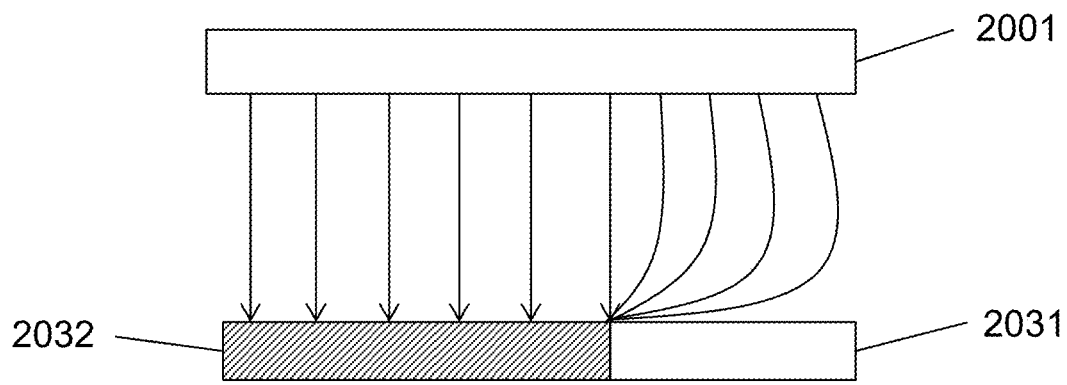
FIG. 20A shows a fundamental principle that why the patterned region adjacent to the notch area will be plated excessively in the existing technologies.
Figure 20B:
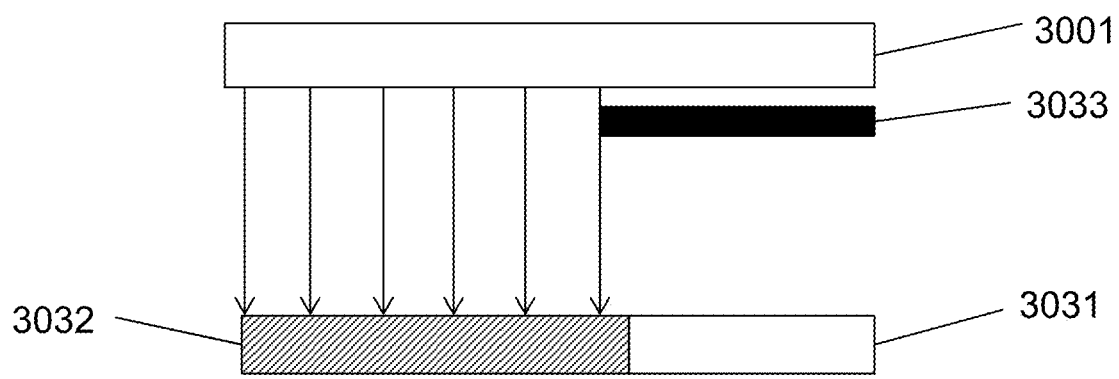
FIG. 20B shows a fundamental principle of the present invention.
Figure 21:
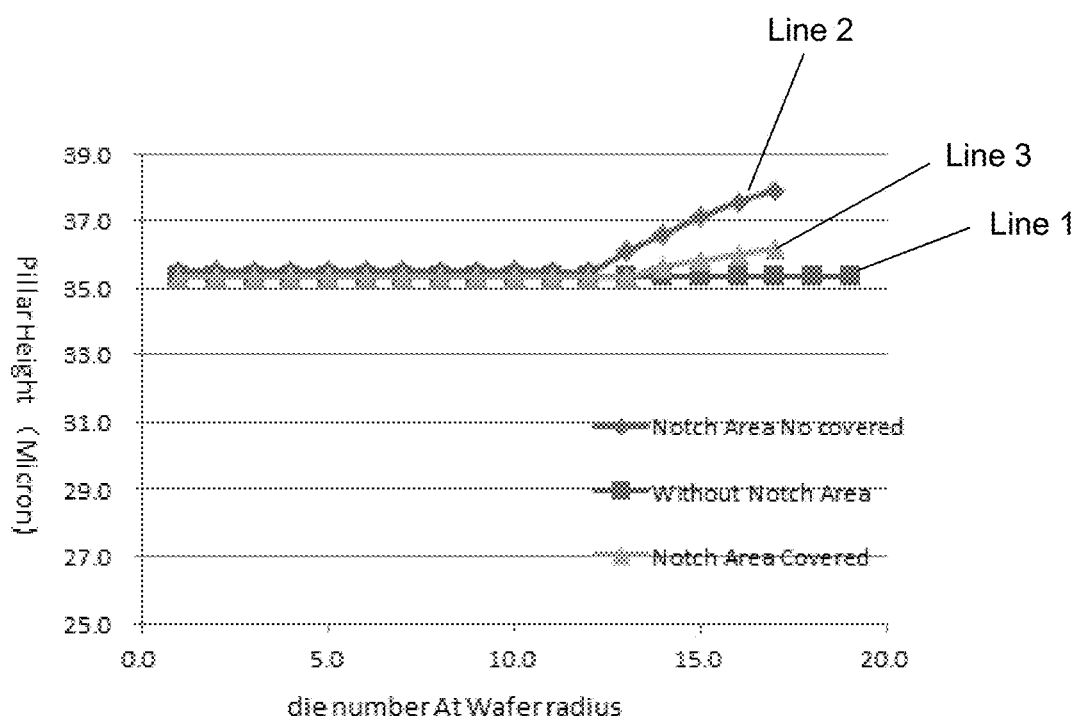
FIG. 21 is an effect contrast chart.
Figure 22:
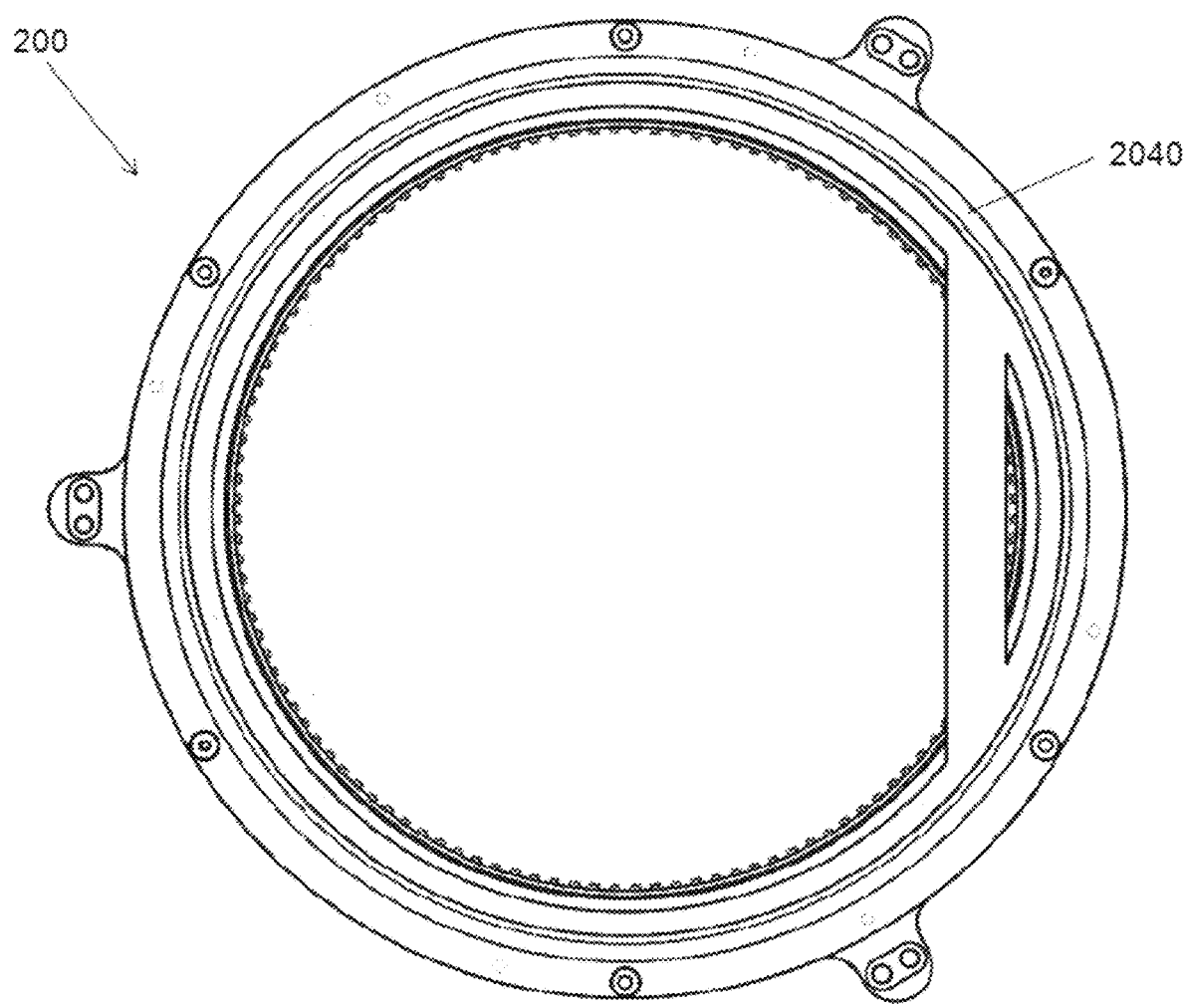
FIG. 22 is a bottom view of a plating chuck according to an exemplary embodiment of the present invention.
Figure 23:
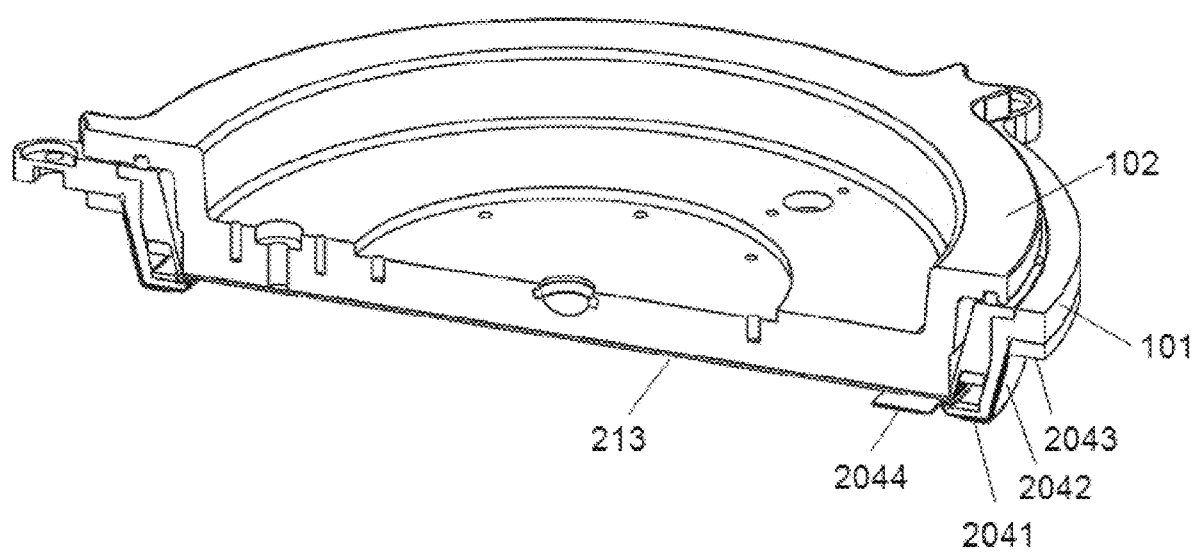
FIG. 23 is a cross-sectional view of the plating chuck.
Figure 24:
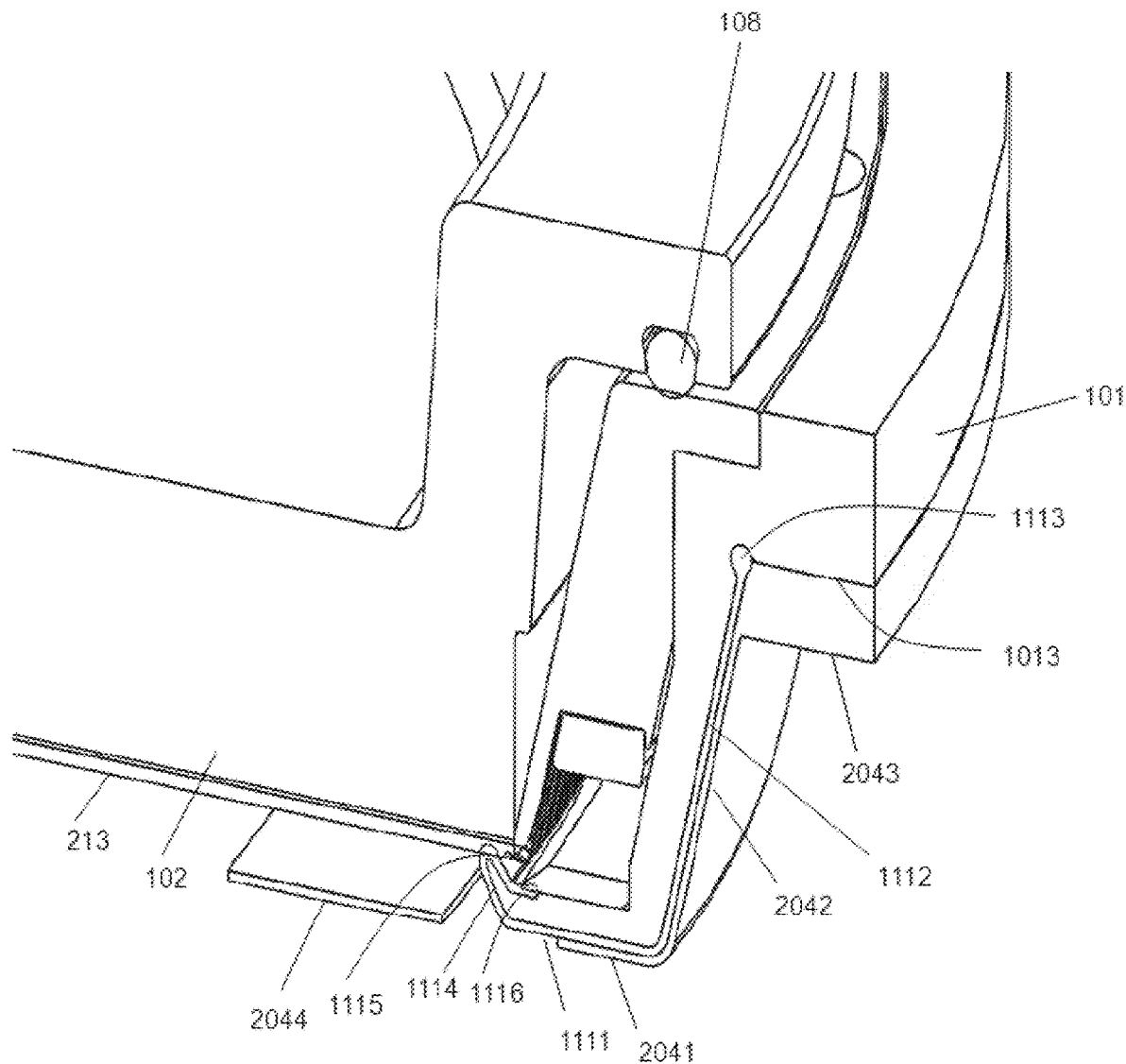
FIG. 24 is a partial enlarged view of FIG. 23.

Referring to FIG. 20B, FIG. 20B discloses a fundamental principle of the present invention. In order to improve the uniformity of plated film nearby a notch area of a substrate, a cover plate is configured to cover the notch area of the substrate to shield the electric field at the notch area when the substrate is being plated. As shown in FIG. 20B, in a plating process, because a cover plate 3033 is configured to cover a notch area 3031 of a substrate, power lines from a virtual anode 3001 corresponding to the notch area 3031 are shielded, weakening the influence on a patterned region 3032 adjacent to the notch area 3031, therefore, further reducing the thickness of plated film on the patterned region 3032 and improving the uniformity of plated film on the substrate. Preferably, the cover plate 3033 also covers partial of the patterned region 3032 adjacent to the notch area 3031 to weaken the electric field at the patterned region 3032 to reduce the thickness of plated film on the patterned region 3032. Referring to FIG. 21, FIG. 21 is an effect contrast chart. In FIG. 21, the line 1 is a plating data corresponding to a substrate without a notch area so that the entire substrate is plated in a plating process. The height of plated pillars has the uniformity across the entire substrate which has no notch area. The line 2 is a plating data corresponding to a substrate having a notch area but having no cover plate to cover the notch area during a plating process. The height of plated pillars at a patterned region adjacent to the notch area is gradually increasing. The line 3 is a plating data corresponding to a substrate having a notch area and a cover plate to cover the notch area during a plating process. The height of plated pillars at a patterned region adjacent to the notch area is reduced to approach the line 1. It can be seen from FIG. 21 that the plating effect with a cover plate is obviously better than the plating effect without a cover plate.

Referring to FIG. 22 to FIG. 25, a plating chuck according to an exemplary embodiment of the present invention is illustrated. The plating chuck 200 is similar to the apparatus 100 and the major difference between the plating chuck 200 and the apparatus 100 is that the plating chuck 200 has a shield 2040. The structures of the plating chuck 200 that are the same as the apparatus 100 will not be described in detail hereinafter. The following will mainly introduce the shield 2040.

Figure 25:
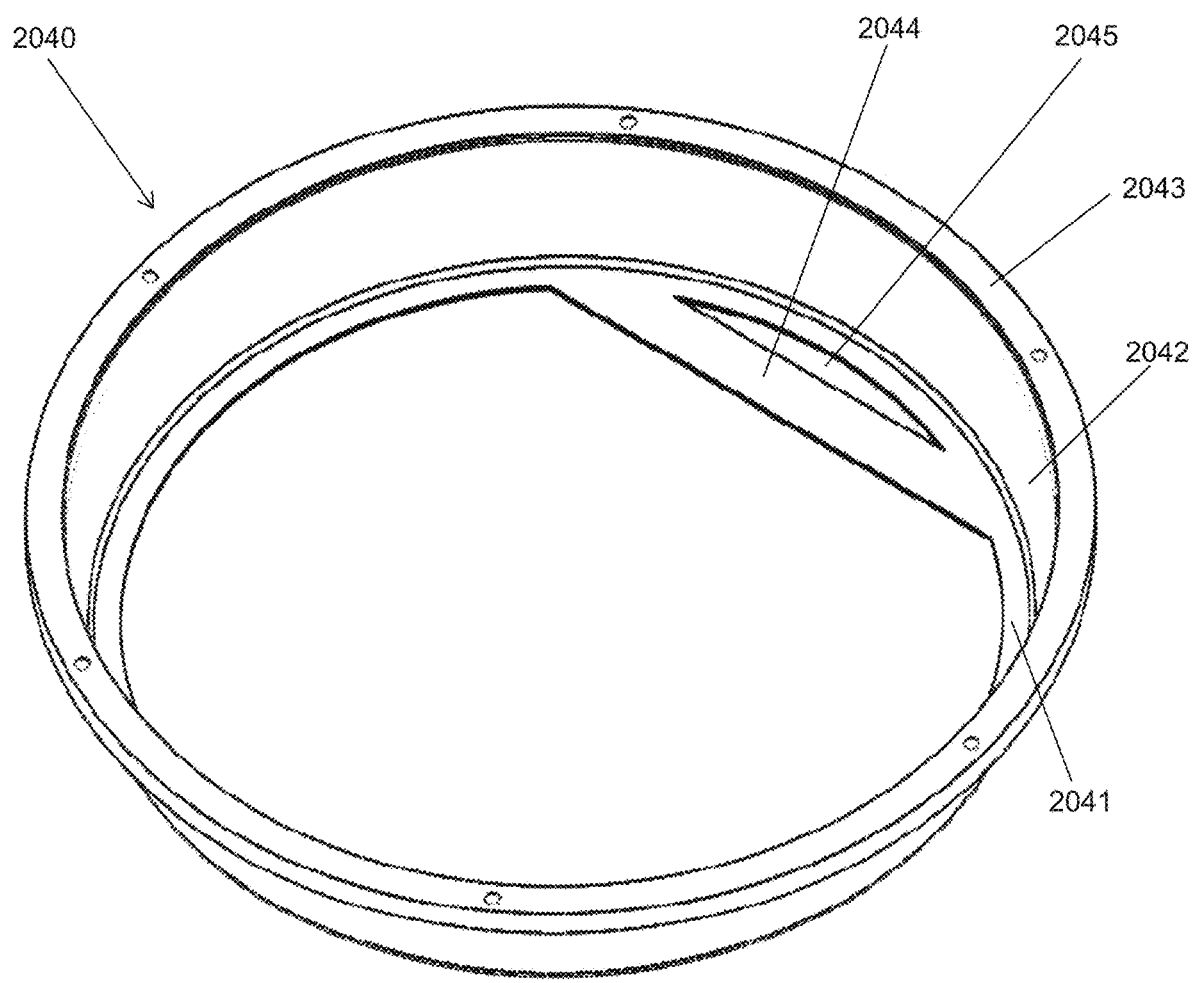
FIG. 25 is a perspective view of a shield of the plating chuck.

As shown in FIG. 25, the shield 2040 has a bottom wall 2041, a side wall 2042 extending upward from the bottom wall 2041, and a top wall 2043 extending outward from the top of the side wall 2042. The bottom wall 2041 horizontally protrudes to form a cover plate 2044. In the embodiment, an opening 2045 is defined on the cover plate 2044. The opening 2045 is a long narrow cut. The opening 2045 is adjacent to the bottom wall 2041. The shield 2040 can be made of plastic, rubber or metal coated by insulting material.

When assembly, the bottom wall 2041 of the shield 2040 is tightly attached on the bottom wall 1111 of the seal shell 111 and wraps partial of the bottom wall 1111 of the seal shell 111, such as wrapping about two thirds of the bottom wall 1111 of the seal shell 111. The side wall 2042 of the shield 2040 is tightly attached on the outer wall 1112 of the seal shell 111. The top wall 2043 of the shield 2040 is tightly attached on the brim 1013 of the chuck cup 101 and is fixed on the brim 1013 of the chuck cup 101 by a plurality of fixing members such as screws. By this way, the top wall 2043 of the shield 2040 can replace the fixing ring 109 to squeeze the protrusion 1113 of the seal shell 111 to further fix the seal shell 111. Therefore, the fixing ring 109 in the embodiment can be cancelled. The cover plate 2044 of the shield 2040 is configured to cover a notch area of a substrate 213 which is held by the plating chuck 200 for plating. There is a distance between the substrate 213 and the cover plate 2044 of the shield 2040 and the distance is larger than the deformation quantity of the cover plate 2044 to avoid the cover plate 2044 contacting the substrate 213. The distance is 0.5 mm to 8 mm, and preferably is 4 mm.

While plating, the cover plate 2044 of the shield 2040 covers the notch area of the substrate 213, and hence power lines from a virtual anode corresponding to the notch area of the substrate 213 are shielded, weakening the influence on a patterned region adjacent to the notch area of the substrate 213, therefore, further reducing the thickness of plated film on the patterned region adjacent to the notch area of the substrate 213 and improving the uniformity of plated film on the substrate 213. Preferably, the cover plate 2044 of the shield 2040 also covers partial of the patterned region adjacent to the notch area to weaken the electric field at the patterned region to reduce the thickness of plated film on the patterned region. The plating electrolyte in the space between the substrate 213 and the cover plate 2044 of the shield 2040 flows through the opening 2045 of the shield 2040 to achieve the flow of the plating electrolyte. Because the plating chuck 200 has the cover plate 2044 to cover the notch area of the substrate 213, in the plating process, the shield 2040 with the cover plate 2044 rotates along with the plating chuck 200. The plating chuck 200 which holds the substrate 213 can rotate in a constant speed or non-constant speed while the substrate 213 is being plated, and the plating effect will not be affected.

Figure 26:
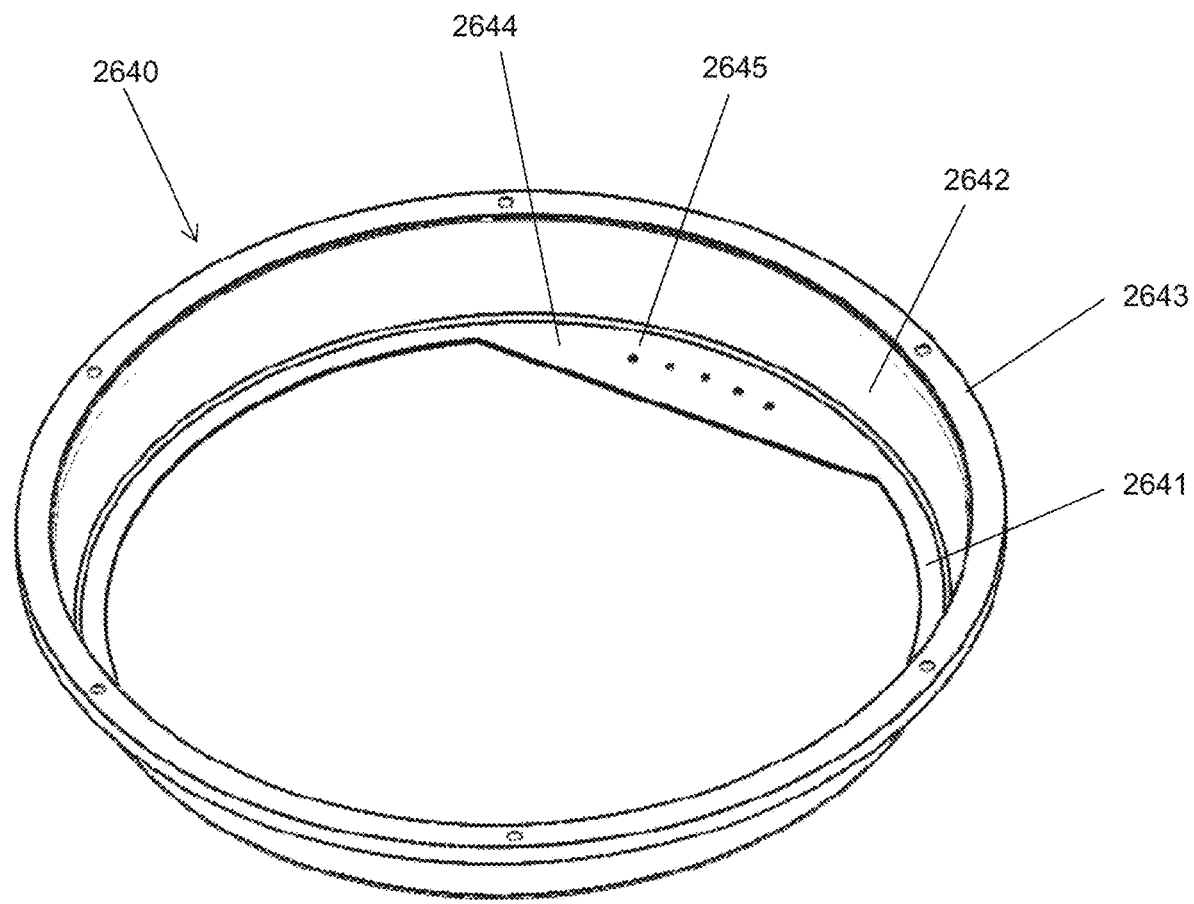
FIG. 26 is a perspective view of a shield according to another embodiment of the present invention.

Referring to FIG. 26, a shield 2640 according to another embodiment of the present invention is illustrated. The shield 2640 has a bottom wall 2641, a side wall 2642 extending upward from the bottom wall 2641, and a top wall 2643 extending outward from the top of the side wall 2642. The bottom wall 2641 horizontally protrudes to form a cover plate 2644. In the embodiment, a plurality of holes 2645 is defined on the cover plate 2644. The cover plate 2644 of the shield 2640 covers a notch area of a substrate during the substrate plating process. Preferably, the cover plate 2644 of the shield 2640 also covers partial of a patterned region adjacent to the notch area of the substrate. The plating electrolyte in the space between the substrate and the cover plate 2644 of the shield 2640 flows through the plurality of holes 2645 of the shield 2640 to achieve the flow of the plating electrolyte. The shield 2640 can be made of plastic, rubber or metal coated by insulting material.

Figure 27:
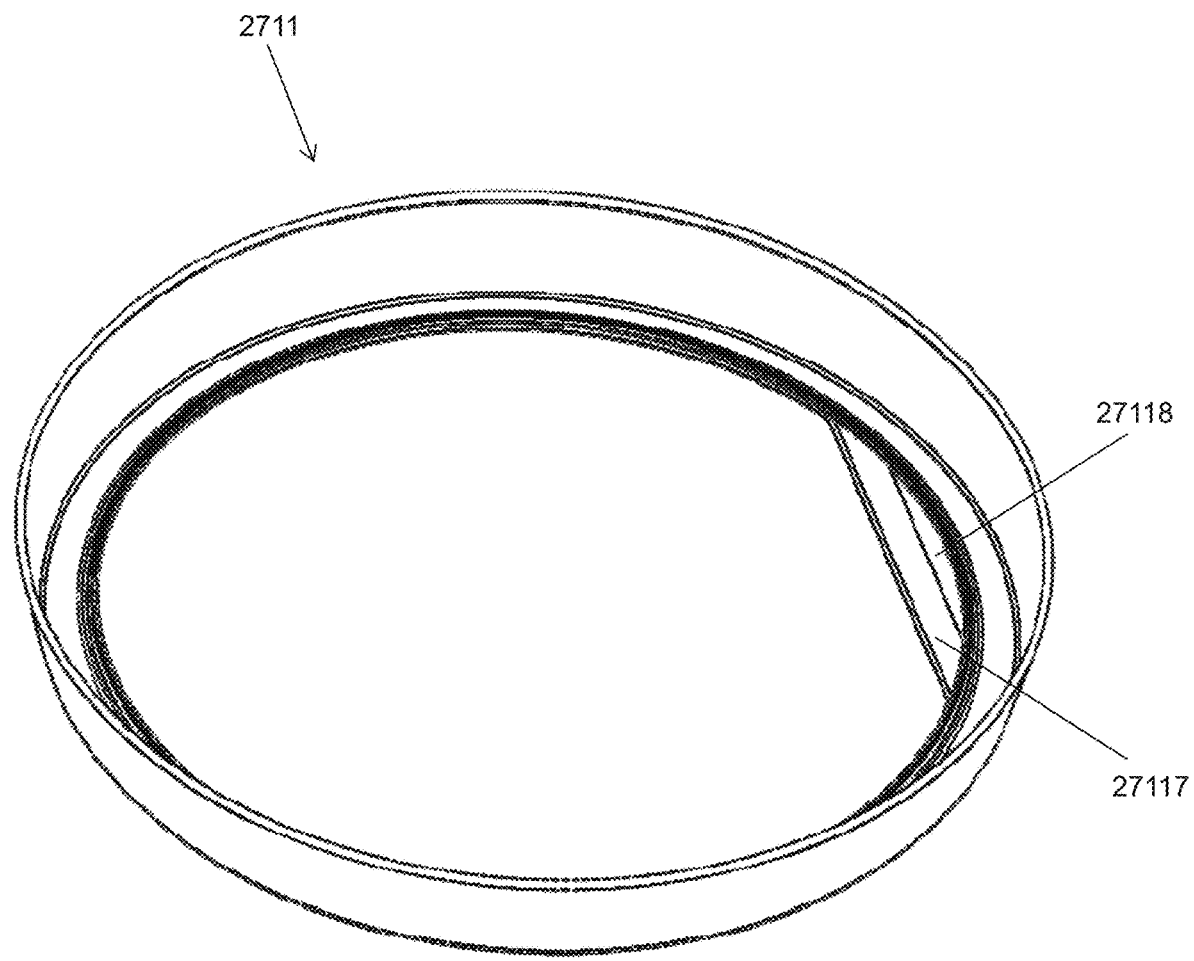
FIG. 27 is a perspective view of a seal shell according to another embodiment of the present invention.
Figure 28:
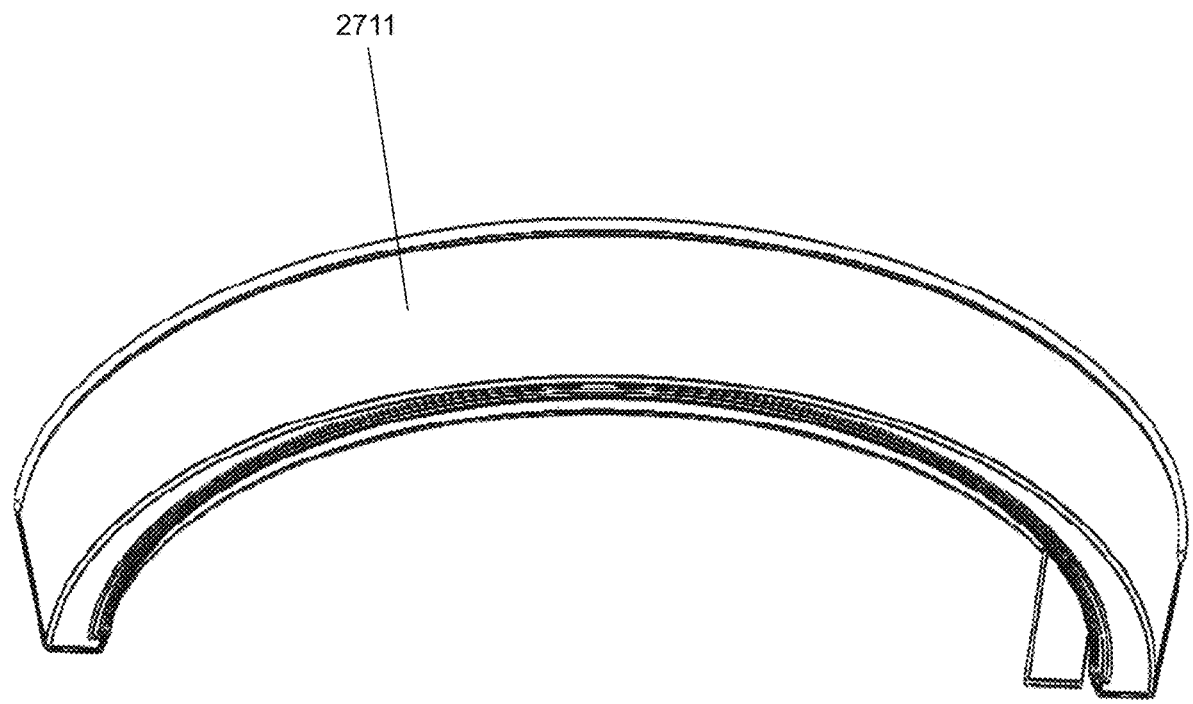
FIG. 28 is a cross-sectional view of the seal shell shown in FIG. 27.
Figure 29:
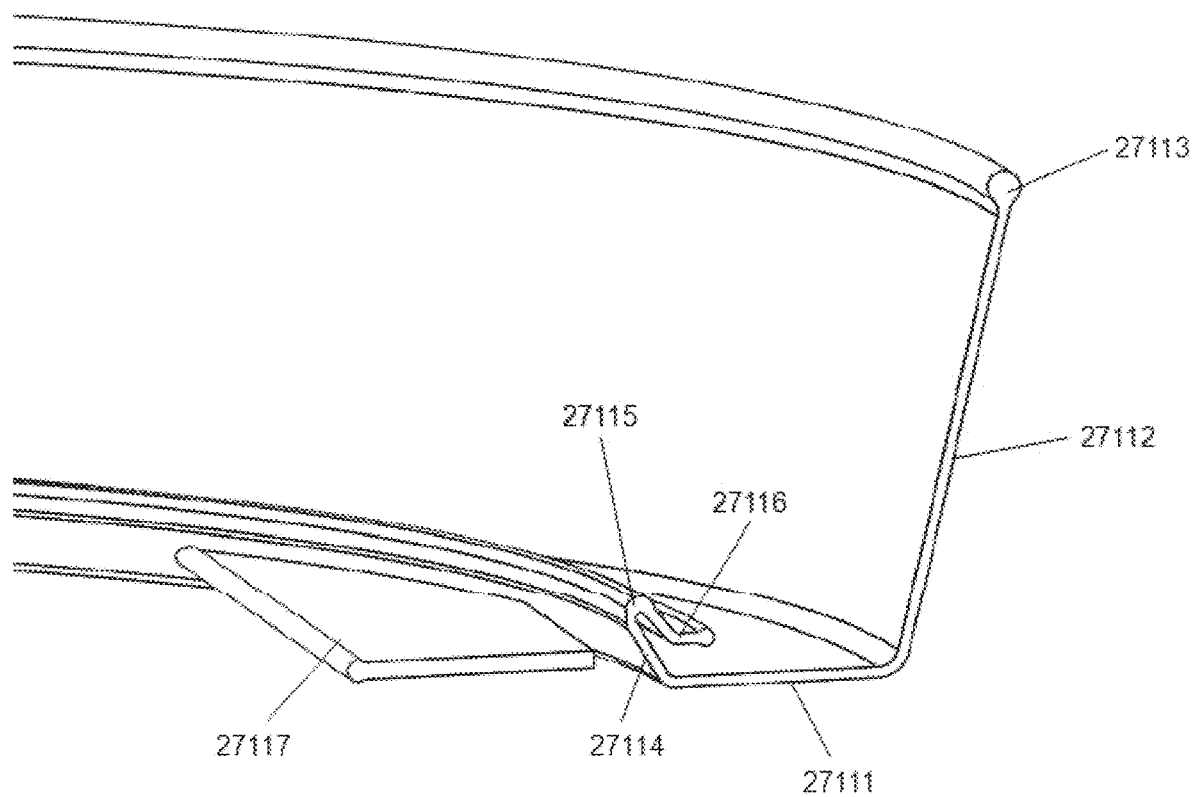
FIG. 29 is a partial enlarged view of FIG. 28.

Please refer to FIG. 27 to FIG. 29, which discloses another embodiment of the present invention. A seal shell 2711 of a plating chuck is illustrated. The seal shell 2711 has a bottom wall 27111, an outer wall 27112 and an inner wall 27114. A tip end of the outer wall 27112 has a protrusion 27113. The inner wall 27114 crooks to form a lip seal portion 27115. A tip end of the inner wall 27114 which connects to the lip seal portion 27115 horizontally extends to form a fixing portion 27116. The inner wall 27114 horizontally protrudes to form a cover plate 27117. In the embodiment, an opening 27118 is defined on the cover plate 27117. The opening 27118 is a long narrow cut. The opening 27118 is adjacent to the inner wall 27114. There may be another way to form the cover plate 27117. The cover plate 27117 with desired shape is horizontally fixed on the inner wall 27114 by such as glue. In the plating process, the cover plate 27117 covers a notch area of a substrate. Preferably, the cover plate 27117 also covers partial of a patterned region adjacent to the notch area of the substrate. The plating electrolyte in the space between the substrate and the cover plate 27117 flows through the opening 27118 to achieve the flow of the plating electrolyte.

Figure 30:
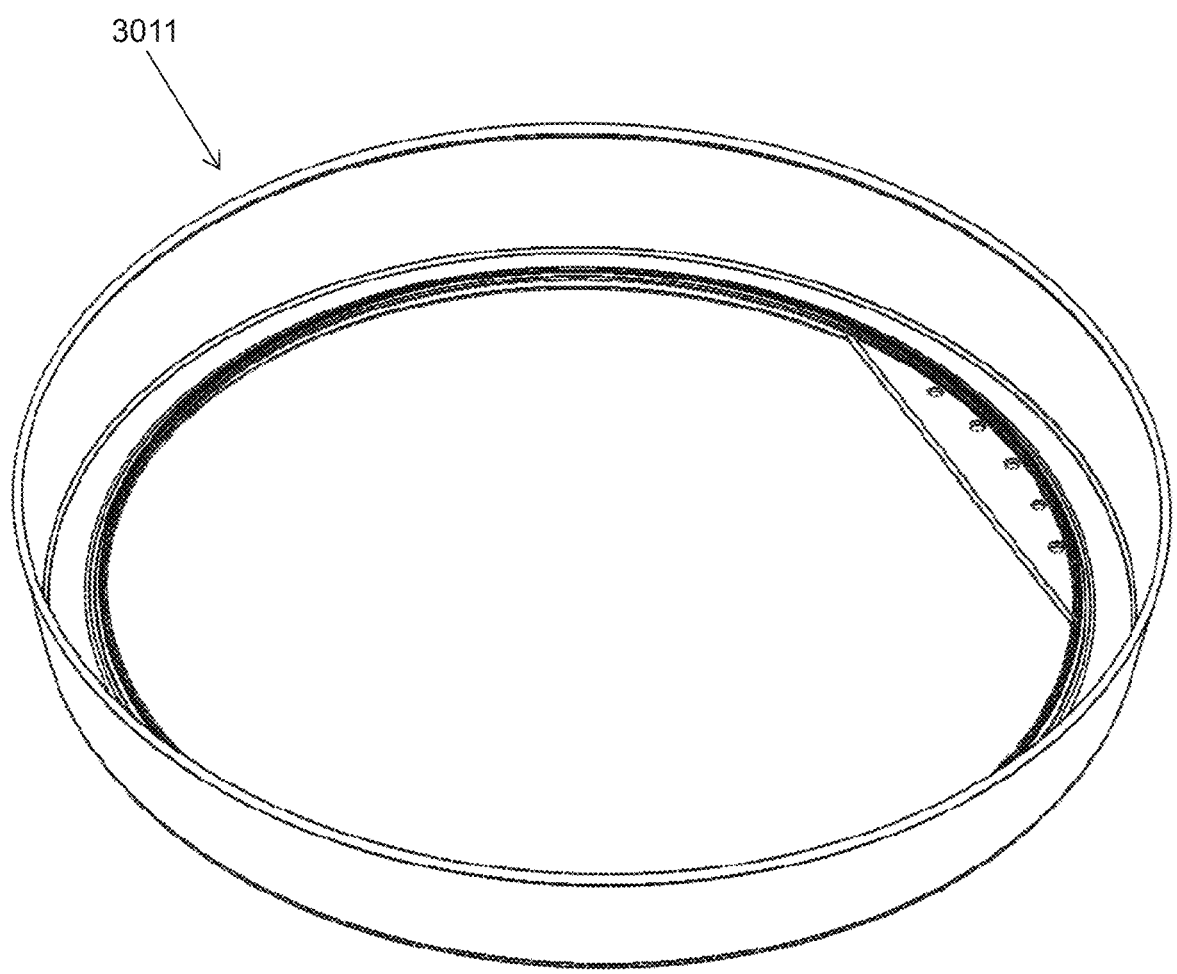
FIG. 30 is a perspective view of a seal shell according to another embodiment of the present invention.
Figure 31:
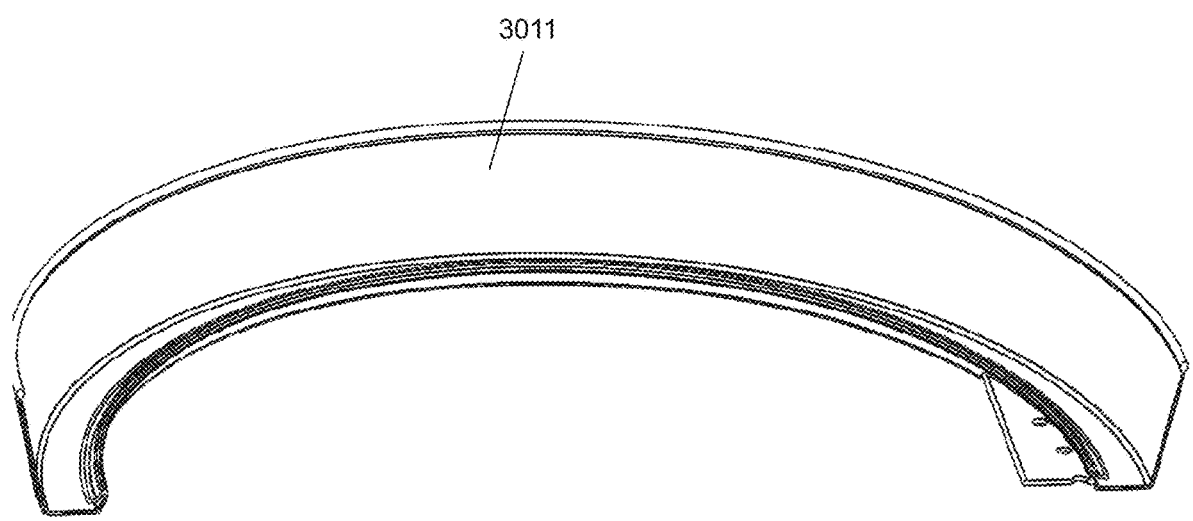
FIG. 31 is a cross-sectional view of the seal shell shown in FIG. 30.
Figure 32:
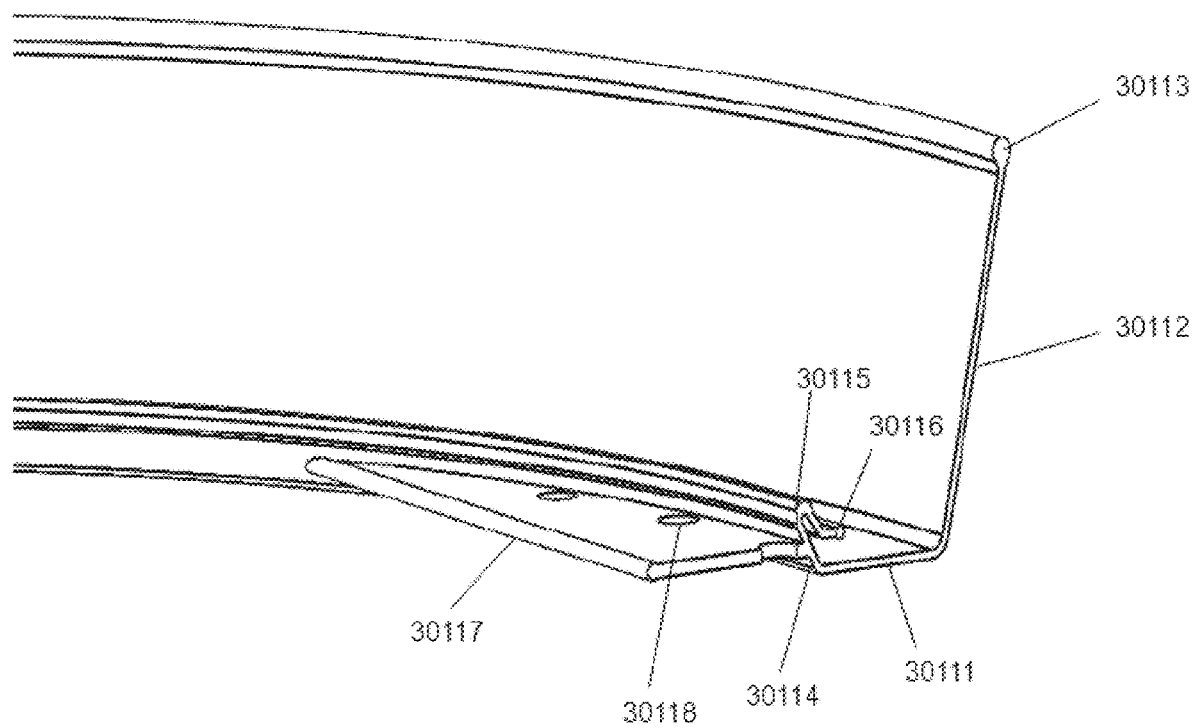
FIG. 32 is a partial enlarged view of FIG. 31.
Figure 33A:
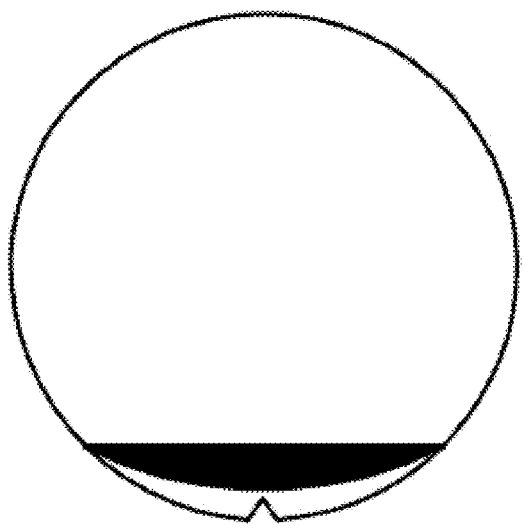
FIG. 33A to FIG. 33H show various shapes of cover plates of the present invention.
Figure 33B:
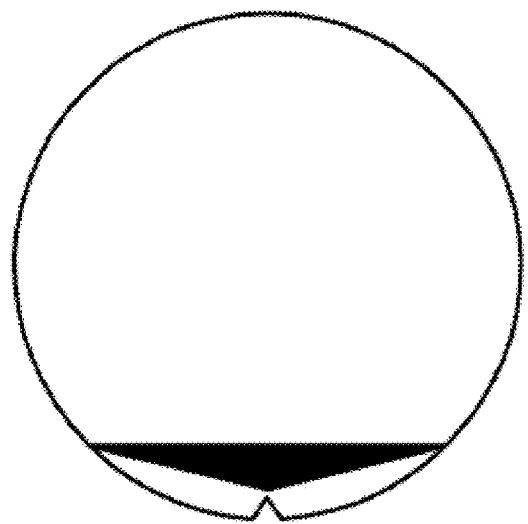
Figure 33C:
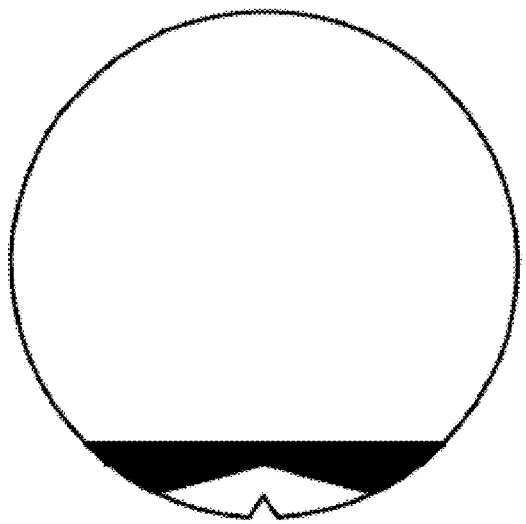
Figure 33D:
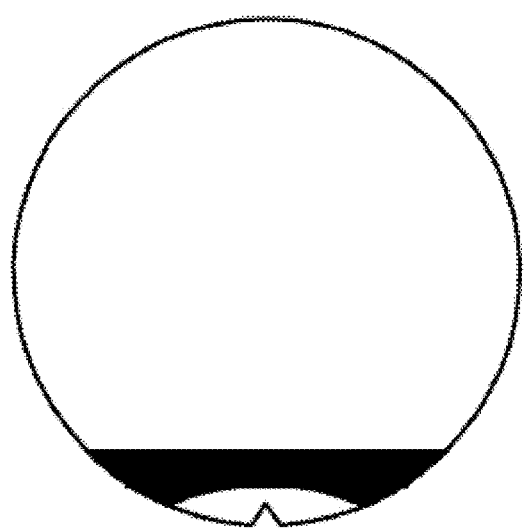
Figure 33E:
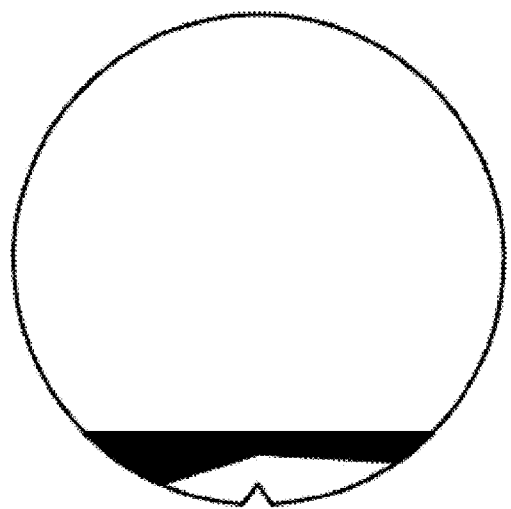
Figure 33F:
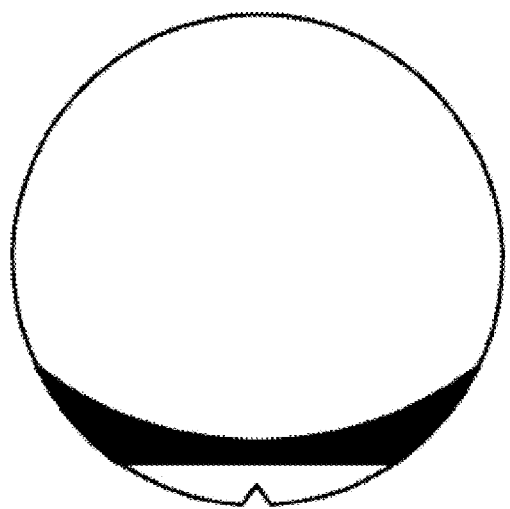
Figure 33G:
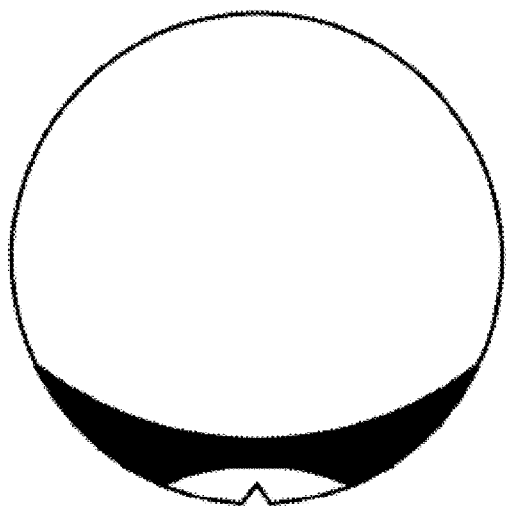
Figure 33H:
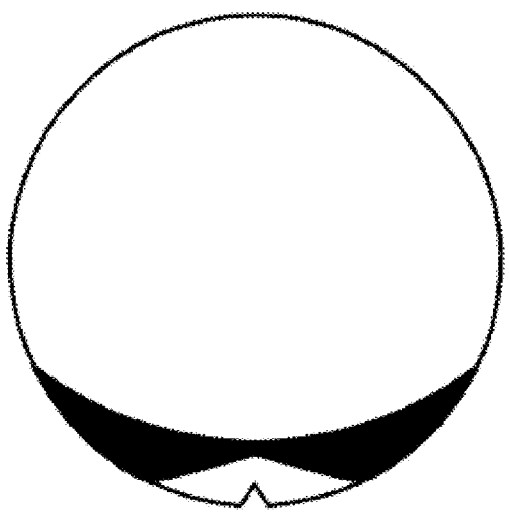

Please refer to FIG. 30 to FIG. 32, which discloses another embodiment of the present invention. A seal shell 3011 of a plating chuck is illustrated. The seal shell 3011 has a bottom wall 30111, an outer wall 30112 and an inner wall 30114. A tip end of the outer wall 30112 has a protrusion 30113. The inner wall 30114 crooks to form a lip seal portion 30115. A tip end of the inner wall 30114 which connects to the lip seal portion 30115 horizontally extends to form a fixing portion 30116. The inner wall 30114 horizontally protrudes to form a cover plate 30117. In the embodiment, a plurality of holes 30118 is defined on the cover plate 30117. In the plating process, the cover plate 30117 covers a notch area of a substrate. Preferably, the cover plate 30117 also covers partial of a patterned region adjacent to the notch area of the substrate. The plating electrolyte in the space between the substrate and the cover plate 30117 flows through the plurality of holes 30118 to achieve the flow of the plating electrolyte.

Referring to FIG. 33A to FIG. 33H, various shapes of cover plates are shown. In these figures, the black parts respectively indicate the cover plates. It can be seen from these figures that the cover plates can be symmetrical or asymmetrical relative to an axis which passes through a center of a substrate and a notch of the substrate. The sides of the cover plates that are farther from the notch of the substrate can be a straight line or an arc line and the other sides of the cover plates that are closer to the notch of the substrate can be a straight line, a polygonal line or an arc line. The shape of the cover plate is adjusted according to the shape of the notch area.

Because the plating chuck of the present invention has a cover plate to cover a notch area of a substrate, in a plating process, the cover plate rotates along with the plating chuck. The plating chuck which holds the substrate can rotate in a constant speed or non-constant speed while the substrate is being plated, and the plating effect will not be affected.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. A plating chuck for holding a substrate comprising a notch area and a patterned region adjacent to the notch area, the plating chuck comprising:
    a shield, wherein the shield has a bottom wall, a side wall extending upward from the bottom wall, and a top wall extending outward from a top of the side wall, the bottom wall horizontally protrudes to form a cover plate, the cover plate being configured to cover the notch area of the substrate to shield the electric field at the notch area when the substrate is being plated;
    wherein the notch area is covered with photoresist and not to be plated.

2. The plating chuck according to claim 1, wherein the cover plate covers partial of the patterned region adjacent to the notch area of the substrate.

3. The plating chuck according to claim 1, wherein an opening is defined on the cover plate.

4. The plating chuck according to claim 1, wherein a plurality of holes are defined on the cover plate.

5. The plating chuck according to claim 1, wherein shape of the cover plate is adjusted according to the shape of the notch area.

6. The plating chuck according to claim 1, wherein the cover plate is symmetrical or asymmetrical relative to an axis which passes through a center of the substrate and a notch of the substrate.

7. The plating chuck according to claim 1, wherein there is a distance between the cover plate and the substrate, the distance is larger than the deformation quantity of the cover plate to avoid the cover plate contacting the substrate.

8. The plating chuck according to claim 1, wherein the material of the cover plate is plastic, rubber or metal coated by insulting material.

9. A plating chuck for holding a substrate comprising a notch area and a patterned region adjacent to the notch area, the plating chuck comprising:
    a seal shell, wherein the seal shell has a bottom wall, an outer wall and an inner wall, the inner wall crooks to form a lip seal portion, the inner wall horizontally protrudes to form a cover plate, the cover plate being configured to cover the notch area of the substrate to shield the electric field at the notch area when the substrate is being plated;

wherein the notch area is covered with photoresist and not to be plated.

10. The plating chuck according to claim 9, wherein the cover plate covers partial of the patterned region adjacent to the notch area of the substrate.

11. The plating chuck according to claim 9, wherein an opening is defined on the cover plate.

12. The plating chuck according to claim 9, wherein a plurality of holes are defined on the cover plate.

13. The plating chuck according to claim 9, wherein the shape of the cover plate is adjusted according to the shape of the notch area.

14. The plating chuck according to claim 9, wherein the cover plate is symmetrical or asymmetrical relative to an axis which passes through a center of the substrate and a notch of the substrate.

15. The plating chuck according to claim 9, wherein there is a distance between the cover plate and the substrate, the distance is larger than the deformation quantity of the cover plate to avoid the cover plate contacting the substrate.

16. A plating chuck for holding a substrate comprising a notch area and a patterned region adjacent to the notch area, the plating chuck comprising:
a cover plate being configured to cover the notch area of the substrate to shield the electric field at the notch area when the substrate is being plated, wherein the side of the cover plate that is farther from the notch of the substrate is a straight line or an arc line and the other side of the cover plate that is closer to the notch of the substrate is a straight line, a polygonal line or an arc line;
wherein the notch area is covered with photoresist and not to be plated.

17. The plating chuck according to claim 16, wherein the cover plate covers partial of the patterned region adjacent to the notch area of the substrate.

18. The plating chuck according to claim 16, wherein the shape of the cover plate is adjusted according to the shape of the notch area.

19. The plating chuck according to claim 16, wherein the cover plate is symmetrical or asymmetrical relative to an axis which passes through a center of the substrate and a notch of the substrate.

20. The plating chuck according to claim 16, wherein there is a distance between the cover plate and the substrate, the distance is larger than the deformation quantity of the cover plate to avoid the cover plate contacting the substrate.

* * * * *